(12) United States Patent
Singer et al.

(10) Patent No.: US 7,911,584 B2
(45) Date of Patent: Mar. 22, 2011

(54) ILLUMINATION SYSTEM FOR MICROLITHOGRAPHY

(75) Inventors: Wolfgang Singer, Aalen (DE); Joachim Wietzorrek, Aalen (DE); Joachim Hainz, Aalen (DE); Gabriele Weirauch, Dresden (DE); Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1092 days.

(21) Appl. No.: 10/563,175

(22) PCT Filed: Apr. 13, 2004

(86) PCT No.: PCT/EP2004/003854
§ 371 (c)(1),
(2), (4) Date: Aug. 9, 2006

(87) PCT Pub. No.: WO2005/015314
PCT Pub. Date: Feb. 17, 2005

(65) Prior Publication Data
US 2007/0058274 A1 Mar. 15, 2007

(30) Foreign Application Priority Data
Jul. 30, 2003 (DE) .................................. 103 34 722

(51) Int. Cl.
*G03B 27/54* (2006.01)
(52) U.S. Cl. ........................................................ 355/67
(58) Field of Classification Search .................... 355/67, 355/53, 71
See application file for complete search history.

(56) References Cited

U.S. PATENT DOCUMENTS

| | | | |
|---|---|---|---|
| 1,880,414 A | 10/1932 | Capstaff | |
| 2,183,249 A | 12/1939 | Schering et al. | |
| 2,186,123 A | 1/1940 | Räntsch et al. | |
| 3,541,323 A | 11/1970 | Stewart et al. | |
| 3,941,475 A | 3/1976 | Sheets | |
| 3,988,066 A | 10/1976 | Suzuki et al. | |
| 4,109,304 A | 8/1978 | Khvalovsky et al. | |
| 4,155,630 A | 5/1979 | Ih | |
| 4,241,389 A | 12/1980 | Heimer | |
| 4,444,456 A | 4/1984 | Jain et al. | |
| 4,497,013 A | 1/1985 | Ohta | |

(Continued)

FOREIGN PATENT DOCUMENTS

DE      561 573      10/1932

(Continued)

OTHER PUBLICATIONS

International Search Report based on PCT/EP2004/003854 dated Oct. 13, 2005.

(Continued)

*Primary Examiner* — Peter B Kim
(74) *Attorney, Agent, or Firm* — Fish & Richardson P.C.

(57) ABSTRACT

The present invention relates to an illumination system for microlithography, especially for wavelengths $\leq 193$ nm, especially preferably for EUV lithography for illuminating a field in a field plane with at least one optical integrator which splits up a light bundle emitted by a light source into a plurality of light channels each having a light intensity, characterized in that
a filter is provided in the light path from the light source to the field plane, with the filter comprising filter elements which are configured in such a way that the light intensity of at least one light channel is reduced in the light path after the filter element.

17 Claims, 23 Drawing Sheets

U.S. PATENT DOCUMENTS

| | | | |
|---|---|---|---|
| 4,521,087 A | 6/1985 | Hayes et al. | |
| 4,683,524 A | 7/1987 | Ohta | |
| 4,918,583 A | 4/1990 | Kudo et al. | |
| 4,936,665 A | 6/1990 | Whitney | |
| 5,098,184 A | 3/1992 | Van Den Brandt et al. | |
| 5,237,367 A | 8/1993 | Kudo | |
| 5,333,166 A | 7/1994 | Seligson et al. | |
| 5,335,044 A | 8/1994 | Shiraishi | |
| 5,594,526 A | 1/1997 | Mori et al. | |
| 5,677,939 A | 10/1997 | Oshino | |
| 5,760,963 A | 6/1998 | Mori | |
| 6,049,374 A | 4/2000 | Komatsuda et al. | |
| 6,195,201 B1 | 2/2001 | Koch et al. | |
| 6,198,793 B1 | 3/2001 | Schultz et al. | |
| 6,281,967 B1 | 8/2001 | Kudo | |
| 6,285,442 B1 | 9/2001 | Sato | |
| 6,438,199 B1 | 8/2002 | Schultz et al. | |
| 6,452,661 B1 | 9/2002 | Komatsuda | |
| 6,573,978 B1 | 6/2003 | McGuire, Jr. | |
| 6,658,084 B2 | 12/2003 | Singer | |
| 6,665,052 B2 | 12/2003 | Sato | |
| 6,673,526 B1 | 1/2004 | Ogawa et al. | |
| 6,704,059 B2 | 3/2004 | Kim | |
| 6,919,951 B2 | 7/2005 | Tsuji | |
| 7,636,149 B2 | 12/2009 | Suzuki | |
| 2001/0046039 A1 | 11/2001 | Kudo | |
| 2002/0131181 A1 | 9/2002 | Singer et al. | |
| 2002/0154284 A1 | 10/2002 | Sato | |
| 2003/0128348 A1* | 7/2003 | Nishi | 355/53 |
| 2003/0227603 A1 | 12/2003 | Dierichs | |
| 2004/0032576 A1* | 2/2004 | Kondo | 355/53 |
| 2004/0257546 A1* | 12/2004 | Banine | 355/53 |

FOREIGN PATENT DOCUMENTS

| | | |
|---|---|---|
| DE | 28 03 277 | 8/1979 |
| DE | 101 38 313 | 7/2002 |
| EP | 0 698 824 | 2/1996 |
| EP | 1 024 408 | 8/2000 |
| EP | 1202101 | 5/2002 |
| EP | 1239330 | 9/2002 |
| EP | 1349009 | 10/2003 |
| JP | 8148415 | 6/1996 |
| JP | 08 181065 | 7/1996 |
| JP | 11 312639 | 11/1999 |
| JP | 11 317348 | 11/1999 |
| JP | 2000-162414 | 6/2000 |
| JP | 2000-162415 | 6/2000 |
| JP | 2000-269114 | 9/2000 |
| WO | WO 00/57459 | 9/2000 |
| WO | WO 01/09681 | 2/2001 |
| WO | PCT/EP02/00608 | 8/2002 |
| WO | WO 02/27401 | 4/2004 |
| WO | WO 2004/100236 | 11/2004 |

OTHER PUBLICATIONS

Written Opinion based on PCT/EP2004/003854 dated Feb. 9, 2006.
U.S. Appl. No. 10/216,547, filed May 22, 2003, Singer.
E. Abbe, "Beiträge zur Theorie des Mikroskops und der mikroskopischen Wahrnehmung," M. Schultze's Archiv fur mikroskopische Anatomie, vol. IX, 413-468 (1873).
H. H. Hopkins, "On the diffraction theory of optical images," Physics Department, Imperial College, London, S.W. 7, 408-432 (1952).
Kurtz et al., "Design and synthesis of random phase diffusers," The Journal of the Optical Society, vol. 63, No. 9, 1080-1092 (1973).
Naumann et al., "Bauelemente der Optik," Carl Hanser Verlag München Wien, 26-31 (1992).

* cited by examiner

ILLUMINATION SYSTEM FOR MICROLITHOGRAPHY

The invention relates to an illumination system for microlithography, especially with wavelengths ≦193 nm, especially preferably the EUV microlithography. The illumination system is used for illuminating a field in a field plane and comprises at least one optical integrator and at least one optical component which is disposed in the light path from a light source to the field plane to be illuminated between the optical integrator and the field plane to be illuminated.

Illumination systems for microlithography, especially high-performance lithography with wavelengths ≦193 nm, are known from a large number of publications.

In order to reduce the structural widths of the electronic components even further, especially in the submicron region, it is necessary to reduce the wavelength of the light used for microlithography. The use of light with wavelengths smaller than 193 nm is possible, e.g. lithography with soft X-rays, the so-called EUV lithography.

EUV lithography is one of the most promising future lithography techniques. Currently wavelengths in the region of 11 to 14 nm are discussed for EUV lithography, especially 13.5 nm with a numerical aperture NA of 0.2 to 0.3. The image quality in EUV lithography is determined on the one hand by the projection lens and on the other hand by the illumination system. The illumination system should provide an illumination of the field plane in which the structure-bearing mask (the so-called reticle) is situated as uniform as possible. The projection lens images the field plane in an image plane (the so-called wafer plane) in which a light-sensitive object is arranged. Projection illumination systems for EUV lithography are equipped with reflective optical elements. The shape of the field of an EUV projection illumination system is typically that of an annular field. Projection systems are usually operated in scanning mode. EUV projection illumination systems are known from U.S. Pat. Nos. 6,452,661, 6,198,793 or 6,438,199 whose disclosure content is hereby incorporated fully in the present application.

The aforementioned EUV illumination systems are comprising honeycomb condensers for adjusting the etendue and for achieving a homogeneous illumination of a field in a field plane. Honeycomb condensers are also known as fly's eye integrators. The honeycomb condensers comprise at least one optical integrator.

An optical integrator in the aforementioned patents U.S. Pat. Nos. 6,452,661, 6,198,793 and 6,438,199 is—without being limited thereto—a facetted optical element with a plurality of raster elements. Alternative integrators are diffusers or integrator rods or light pipes. In a preferred embodiment the honeycomb condensers comprise two facetted optical elements with a plurality of raster elements.

Honeycomb condensers in the patents U.S. Pat. Nos. 6,452,661, 6,198,793 or 6,438,199 have been described for EUV lithography in a reflective design. Honeycomb condensers in refractive design (e.g. for microlithography with wavelengths of 153 nm or 193 nm) are generally known from a large number of other publications.

Honeycomb condensers can also be designated as diffusers according to a general definition which produce a certain divergence angle of a radiation in a conjugated pupil plane of an imaging system such as a projection lens for microlithography. The plane in which or shortly before which the diffuser or honeycomb condenser is arranged is thus a plane which is optically conjugated to the exit pupil of the illumination system and which coincides with the entrance pupil of the subsequent projection lens.

Diffusers for the homogeneous illumination of a field plane are known from a large number of applications, e.g. from U.S. Pat. Nos. 4,936,665, 4,521,087, 4,444,456 and 4,155,630. U.S. Pat. Nos. 4,936,665, 4,155,630 and 6,573,978 show diffusers which are arranged in or close to a conjugated plane of an exit pupil of an illumination system. The diffusers are configured in such a way that the field plane to be illuminated is illuminated in a predetermined manner almost uniform. This is achieved in such a way that a certain divergence angle of the radiation is present behind the diffusers as a result of the optical effect of the diffusers, so that the field plane is illuminated in the predetermined manner behind the diffusers according to the divergence angle.

In addition to honeycomb condensers, there are light guides such as integrator rods or light pipes for illuminating a plane. U.S. Pat. No. 3,541,323 discloses a combination of facetted optical elements and optical waveguides for use in the homogenization of laser radiation. Optical waveguides of the kind as described in U.S. Pat. No. 4,918,583 are generally regarded as related to and exchangeable against facetted optical elements, but they show a significant difference. Optical waveguides or integrator rods as are also known from U.S. Pat. No. 1,880,414 already produce a homogeneously illuminated plane on the exit side which is usually arranged in a conjugated manner relative to the field plane to be illuminated. The cross section of the waveguide or integrator rod is preferably chosen in the form of the plane to be illuminated and the light exit surface is imaged in the field plane to be illuminated by means of imaging optical system. The entrance surface of the rod which substantially has the same shape as the exit surface but is possibly of a different size thus also corresponds to the field plane to be illuminated. The entrance and exit surface of the integrator rods are thus in the wider sense both conjugated to the field plane.

In the case of the honeycomb condenser and the diffuser, the facetted optical element is arranged in a conjugated pupil plane within the terms of the principle of Köhler illumination, i.e. the exit surface of the honeycomb condenser is projected with the aid of an optical component in the exit pupil of the illumination system which corresponds to the entrance pupil of a subsequent projection lens. In a honeycomb condenser, light bundles are supplied in a single ratio to the second raster elements (hereinafter referred to as pupil honeycombs) through the first raster elements (hereinafter referred to as field honeycombs), such that the field honeycomb and the pupil honeycomb are spatially located at a comparable location on the first or second facetted optical element. In this case the entrance plane of the honeycomb condenser in which the field honeycombs are situated corresponds substantially to a pupil plane. This means that the second facetted optical element is illuminated like the first optical element, e.g. with circular illuminations of a different diameter, with oblique symmetrical illumination as is well known from microscopy, or annular illumination.

As described above, honeycomb condensers are used as optical means for splitting an incident light flux or a light bundle impinging on the same into a plurality of light bundles and facetted optical elements are optionally used for reuniting and overlapping the split light fluxes. For example, said facetted optical elements can be arranged with a plurality of raster elements as lens arrays. An optical effect of the individual raster elements is not necessary in all applications. The individual raster elements can then also be arranged as plane mirrors or prisms. Generally, the raster elements can be provided with a refractive, reflective or diffractive configuration. A refractive honeycomb condenser is shown for example by U.S. Pat. Nos. 5,098,184 and 5,594,526.

U.S. Pat. Nos. 2,183,249 and 2,186,123 each disclose a honeycomb condenser with two facetted elements which are each arranged as a lens array for the homogeneous illumination of a field plane. The radiation which is incident in the plane before the honeycomb condenser or the light bundle which is incident on the honeycomb condenser is broken down in the honeycomb condenser channel by channel into individual radiant fluxes or a plurality of light bundles. A plurality of secondary light sources is formed in the exit plane of the honeycomb condenser which is also known as pupil plane. The shape of the first raster elements of the first facetted optical elements of the honeycomb condenser is projected in a field to be illuminated in the field plane by the second raster elements of the second facetted optical element and an optical component which is disposed between the honeycomb condenser and the field plane. In the field to be illuminated the plurality of light bundles which start from the plurality of first raster elements are being superimposed. The shape of the first raster elements thus also determines the shape of the illuminated field. Therefore the first raster elements are also designated as field honeycombs. The second raster elements are arranged in or close to a pupil plane conjugated to the exit pupil in which a plurality of secondary light sources are formed. The second raster elements are therefore also known as pupil honeycombs. The shape of the pupil honeycombs is preferably also chosen in such a way that they correspond to the shape of the secondary light source. In the above specifications the shape of the first raster elements is chosen like the field to be illuminated, i.e. rectangular, and the shape of the second raster element is chosen hexagonally, which thus roughly corresponds to the shape of the round light sources. U.S. Pat. No. 2,183,249 further shows a honeycomb condenser consisting of reflective field honeycombs and refractive pupil honeycombs. A similar configuration has already been shown in DE 561 573, which consists of reflective field honeycombs and refractive pupil honeycombs. DE 28 03 277 shows how refractive honeycomb condenser systems can be transferred into reflective honeycomb condenser systems. FIG. 6 of the cited specification DE 28 03 277 shows a refractive honeycomb condenser and FIG. 7 the respective example of a reflective honeycomb condenser, each provided for the homogeneous illumination of a field plane in which in DE 28 03 277 a mask is arranged for illuminating a substrate for producing semiconductor elements.

U.S. Pat. No. 3,941,475 shows a honeycomb condenser with a diaphragm arranged in the vicinity of the honeycomb condenser in order to vary the illumination setting for microlithography. U.S. Pat. No. 3,988,066 finally proposes further means in conjunction with a honeycomb condenser, so that the illumination setting can be varied depending on the structure. U.S. Pat. No. 5,237,367 discloses a honeycomb condenser with a zoom lens system situated before the same for changing the pupil illumination and the imaging settings.

U.S. Pat. No. 4,497,013 provides the arrangement of several integrators for the purpose of further improvement of light mixing, e.g. two honeycomb condensers arranged one after another.

U.S. Pat. No. 4,683,524 discloses a honeycomb condenser as means for producing a homogeneous illumination in a field plane, with the pupil illumination for illuminating the mask being achieved with respective illumination angles by a suitable choice of the expansion of the honeycomb condenser. The illumination of the honeycomb condenser is configured in such a way that the outer regions of the honeycomb condenser and thus the pupil at the pupil edge are illuminated with a higher intensity.

U.S. Pat. No. 5,335,044 shows a refractive honeycomb condenser with a diaphragm arranged close to the honeycomb condenser for trimming only partly illuminated field honeycombs in order to ensure a more homogeneous field plane illumination.

U.S. Pat. No. 6,049,374 shows a honeycomb condenser with a filter element in a plane conjugated to the field plane in order to compensate field-dependent deviations from the ideal imaging properties by an imaging setting which varies over the field.

As already mentioned above, honeycomb condensers require an optical imaging system which performs a pupil imaging. Since the secondary light source is formed in the exit plane of the honeycomb condenser which is a conjugated pupil plane or is close to the same, it is possible to achieve any virtually desirable pupil illumination through a certain choice of the light channels between the first facetted optical element and the second facetted optical element, e.g. through a channel selection diaphragm or any respective structured illumination of the honeycomb condenser, as described in the patents U.S. Pat. Nos. 3,941,475 and 4,109,304. In U.S. Pat. No. 3,941,475 the pupil illumination is controlled by diaphragms close to the facetted optical elements. In U.S. Pat. No. 4,109,304 the annular illumination is produced by optical means, which entails fewer light losses. The use of zoom systems for controlling the pupil illumination within the terms of Koehler illumination is known, as disclosed in U.S. Pat. No. 4,241,389.

A light mixing which is sufficient for conventional applications is achieved by superimposing a plurality of light bundles in the field plane with the help of the honeycomb condensers. A substantially homogeneous illumination in the field plane can thus also be achieved when the demand for a field-independent pupil illumination can be omitted.

The disadvantage in the illumination systems in accordance with the state of the art is that no pupil has been achieved which is substantially uniform illuminated over the illuminated field.

It is therefore an object of the present invention to provide a substantially error-free illumination of the exit pupil in the pupil plane which is as field-independent as possible and furthermore uniform over the field, as is required in high-performance lithography systems, i.e. the coherence parameters set over the field do not change.

Furthermore, the field itself is to be illuminated in the field plane in a substantially uniform manner.

The object of the invention is solved in that the illumination system comprises at least one optical integrator which divides the light of a light source into a plurality of light channels, each having a light intensity. The illumination system furthermore comprises a filter with at least one filter element, wherein the filter element being configured in such a way that the light intensity of at least one channel is reduced.

In a further embodiment an optical component is provided which is arranged in the light path between the honeycomb condenser and the field plane to be illuminated and is preferably sufficiently corrected in an aplanatic manner. The illumination system comprises a filter with at least one filter element which is/are configured and situated in such a way that a substantially uniform illumination of the field in the field plane is achieved.

As is known to a person skilled in the art, aplanatic correction and fulfillment of the sine condition are mutually conditional and are only descriptions of the same fact; both terms are therefore used synonymously.

An optical system is regarded as being corrected aplanatic (as explained by E. Abbe in "Beiträge zur Theorie des Mikroskops und der mikroskopischen Wahrnehmung" (Contributions to the Theory of the Microscope and Microscopic Observation), M. Schultze's Archiv für mikroskopische Anatomie, Vol. IX, 413-468 (1873)) when between the height of the ray p in a pupil plane and the ray angle $\partial$ in a field plane the relationship p=f sin $\partial$ is obtained, with f being the focal distance of the lens group between pupil and field plane. Analogously, aplanatic correction is referred to in the contrary case, namely when a relationship x=f sin b is obtained between the ray angle b in a pupil plane and the ray height x in a field plane. In the present case the lens group corresponds to the optical component which is arranged between the honeycomb condenser and the field plane to be illuminated. The expansion of the honeycomb condenser with a diameter $2p_{max}$ is thus transferred in a constant angular spectrum in the field plane with the sine of the maximum angle $\sin \partial_{bel} = p_{max}/f$. The field illumination up to the field height $x_{max}$ is thus given by the sine of the aperture angle $\sin b_{max}$ in a pupil plane, i.e. behind the honeycomb condenser, with sin $b_{max} = x_{max}/f$. f is in this case the focal distance of the lens group between the pupil and the field plane. This is shown in FIG. 3.

In this application the aplanatic correction or the Abbe sine condition (i.e. that the optical element is sufficiently corrected in an aplanatic way) is sufficiently fulfilled in case the equation sin $\partial$=p/f is fulfilled better than 10%, especially better than 2%, for all pupil coordinates p, i.e. all light rays which intersect a point p in a pupil plane extend in the region of the field plane parallel with respect to each other with maximum angular deviations, such that the sines of the propagation angles vary less than 10%, especially less than 2%. In an analogous manner, sufficient aplanatic correction shall be understood in this application when the rays of a ray bundle which pass a pupil plane intersect according to x=f sin b in a point x in the field plane with a ray angle b to the optical axis with maximum point image distortions of 10%, especially preferably 2% of the field height x.

This corresponds for the projection of the plane behind the honeycomb condenser in the entrance pupil to a deviation from the Abbe sine condition by less than 10%, especially preferably less than 2%, i.e. the imaging scale β for the projection from the plane behind the honeycomb condenser in the entrance pupil may vary by a maximum of 10% over the angle b of a ray behind the honeycomb condenser in respect to the optical axis. This ensures a variation of the maximum aperture angle $\partial_{bel}$ in the field plane of less than 10%, especially preferably 2%, according to a so-called σ-variation of less than 10%, especially preferably 2%.

When the optical component sufficiently complies with the Abbe sine condition, then the optical component is very good sine-corrected, leading to the consequence that the projection of the secondary light source in the exit pupil of the illumination system which coincides with the entrance pupil of the projection lens of a projection illumination system is substantially free of errors. As a result of the aplanatic correction it is ensured that each pupil which is assigned to a respective field point of the field to be illuminated in the field plane is always approximately of the same size in the plane of the entrance pupil. This will be explained below by reference to an example of a telecentric system. In a telecentric system the pupil plane and the field plane are mutually Fourier inverse, i.e. the entrance pupil lies in infinity from the viewpoint of the reticle. When the sine condition is fulfilled it is ensured that parallel rays from the pupil plane intersect in the field plane in a common point. If there is a certain radiation characteristic in the light path downstream the honeycomb condenser or diffuser, all rays which have a certain angle of inclination relative to the optical axis define the reflection intensity at the one assigned point in the field plane. When the honeycomb condenser or diffuser has a homogeneous reflection within a certain region, every field point will conversely receive radiation from this region of the honeycomb condenser or diffuser. If the region of the honeycomb condenser or diffuser which is effective from the reticle is to be field-independent, i.e. the same angular spectrum of illumination beams is to be present at each field point, then this is achieved in accordance with the definition by the aplanatic correction and fulfillment of the sine condition for the projection of the exit plane of the honeycomb condenser or diffuser in the exit pupil. The given deviation for telecentric conditions can be transferred without any limitations by the person skilled in the art in an obvious manner to the non-telecentric illumination case.

In order to achieve a uniform illumination of the pupils associated with the respective field points in the exit pupil, it is advantageous when the light flux incident upon the first optical element with raster elements is substantially uniform. An even or uniform illumination of the first optical element with raster elements, i.e. the field honeycomb plate, then leads to uniform bright secondary light sources in the exit plane of the honeycomb condenser, with the divergence angles of the individual light bundles of the secondary light sources being limited by the field honeycomb.

In order to achieve both a uniform illuminated pupil for each field point in the field plane as well as a homogeneously illuminated field in the field plane, it is necessary to provide means which ensure that the reflection characteristics of the secondary light sources within the maximum divergence angle act virtually like a Lambert's radiator, i.e: the radiant intensity I(α) (which is the radiant flux $\phi_e$ of a light bundle) which is radiated under an angle α in a solid angle element dΩ behaves like the cosine of the angle of radiation with respect to a radiant intensity I(0) of a light bundle which is radiated parallel to the optical axis.

The present application makes use of the lighting engineering terms as listed in Naumann/Schröder, "Bauelemente der Optik" (Components of Optics), Hauser-Verlag 1992, p. 28-29.

TABLE 1

Lighting engineering terms

| Physical quantity | Formula | Unit |
| --- | --- | --- |
| Radiant flux $\Phi_e$ | $\Phi_e = \partial Q/\partial t$ | Watt (W) |
| Irradiance or flux density Elements | $E_e = d\phi_e/d A_o$ | Watt/cm$^3$ |
| Radiant intensity $I_e$ | $I_e = d\phi_e/d\Omega$ | Watt/steradian |
| Radiance $L_e$ | $L_e = d\phi_e/d A_s \cos \alpha \, d\Omega$ | Watt/cm$^2$/steradian |

A homogeneous illumination of the field in the field plane will only be achieved when the secondary light sources which are produced by the honeycomb condenser and a possibly preceding lens system has reflection characteristics which are comparable with a Lambert's radiator. Such reflection characteristics are generally not present. Such reflection characteristics are especially not achieved in illumination systems which are commonly used in EUV lithography.

In accordance with the invention at least one filter element is provided in order to correct the homogeneity of the field to be illuminated and to ensure respective reflection characteristics of the secondary light sources. The means invented for this purpose are substantially filter elements, especially grey filters which perform a filtering of the radiation via a location-dependent variation of the transmission (i.e. a location-dependent reduction of the light intensity of a light channel) in such a way that the reflection of the secondary light sources becomes sufficiently Lambert-like, i.e. the density of the radiant fluxes of the individual light bundles which start out from the first raster elements (i.e. the field honeycombs) is varied in a location-dependent manner such that a homogeneous illumination of the field plane is obtained. Preferably, the reduction of the light intensity is in the region of >0% to <100% of the total irradiated light intensity of a light channel, i.e. the transmission of the filter element for example lies in the region of >0% to <100% for the total light intensity of a light channel. Especially preferably is the reduction of the total light intensity of a light channel from about >25% to about <80%, i.e. the transmission of the filter element lies between >20% and <75% for the entire light channel. The filter elements in accordance with the invention can further be combined with other means for changing the coherence parameters and, if an adjustment to the other means is necessary, can also be changed by exchange or by active elements. If the projection setting is to be changed from circular illumination of the exit pupil to annular illumination or multi-polar illumination by diaphragms or other optical elements such as conical elements, diffractive elements or prisms, it may be necessary to adjust the correction filter in accordance with the invention or the setting or coherence parameter setting can be made directly via the correction filter in accordance with the invention, which is then exchanged via a filter wheel for example for a specific setting.

In a preferable embodiment of the invention the field to be illuminated is a ring field with an azimuthal and a radial expansion.

When the ring field is formed with the aid of a field-forming optical component it is advantageous when the optical element is sufficiently aplanatically corrected in the radial direction of the field in the field plane to be illuminated. In the other direction, i.e. in the azimuthal direction relating to the pupil coordinates, this is not possible as a result of the field-forming lens system.

The filter element which ensures a substantially homogeneous illumination of the field in the field plane can be arranged in the light path from the light source to the field plane close to the optical integrator as a separate component or can be integrated in the optical integrator. In a first embodiment of the invention the filter element is arranged as a separate optical component and it can be arranged in the light path from the light source to the field plane in front of and/or close to the optical integrator. Alternatively to this arrangement it is possible to arrange the filter element in the light path from the light source to the field plane behind and close to the optical integrator. In an especially preferable embodiment the optical integrator comprises a first facetted optical element with a plurality of first raster elements. In an especially advantageous embodiment the optical integrator further comprises a second facetted optical element with a plurality of second raster elements. In the case of a double-facetted optical integrator it is possible to arrange the filter in accordance with the invention in the light path from the light source to the field plane between the first facetted optical element and the second facetted optical element.

Instead of a honeycomb condenser which is configured as an optical integrator with individual discrete facets, it is also possible to achieve the effect of a honeycomb condenser in an illumination system by a diffuser which can be arranged as a free-form surface. Such free-form surfaces are especially characterized in that they are not made of individual elements, but are continuously differentiable over the entire surface. The free-form surface comprises a plurality of elevations and indentations. The elevations and indentations define points of a grid. Each surface portion between the grid points can be described by a locally continuously differentiable function, especially a locally twofold continuously differentiable function, i.e. so-called splines. A simple example for such a diffuser which consists of a free-form surface is known from EP 1 024 408.

Since the invention is not limited to reflective illumination systems but also comprises refractive illumination systems, the filter element can be configured both as a transmissive filter element with variable transmission as well as a reflective filter element with variable reflectivity.

An especially preferable embodiment is represented by a filter element which is arranged as a variable grey filter, with the variable grey filter comprising a variable line and/or point density, so that the grey values of the grey filter can be set through the line and/or point density.

In order to achieve a homogeneous illumination of the field plane for different illumination settings, it is provided advantageously that the filter element is exchangeable.

In addition to the illumination system the invention also provides a projection illumination system for microlithography which comprises an illumination system in accordance with the invention as well as a method for producing microstructured components by using a projection illumination system in accordance with the invention.

The invention will be described below by way of example with reference to the embodiments and the figures, wherein.

Figure 17A:
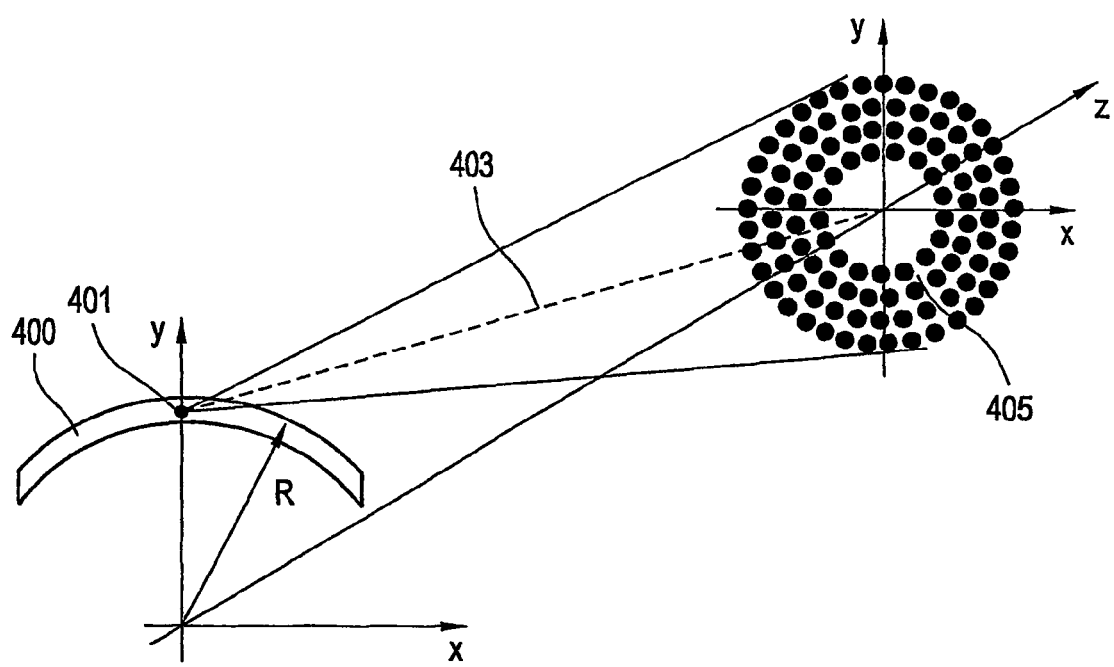
Figure 17B:
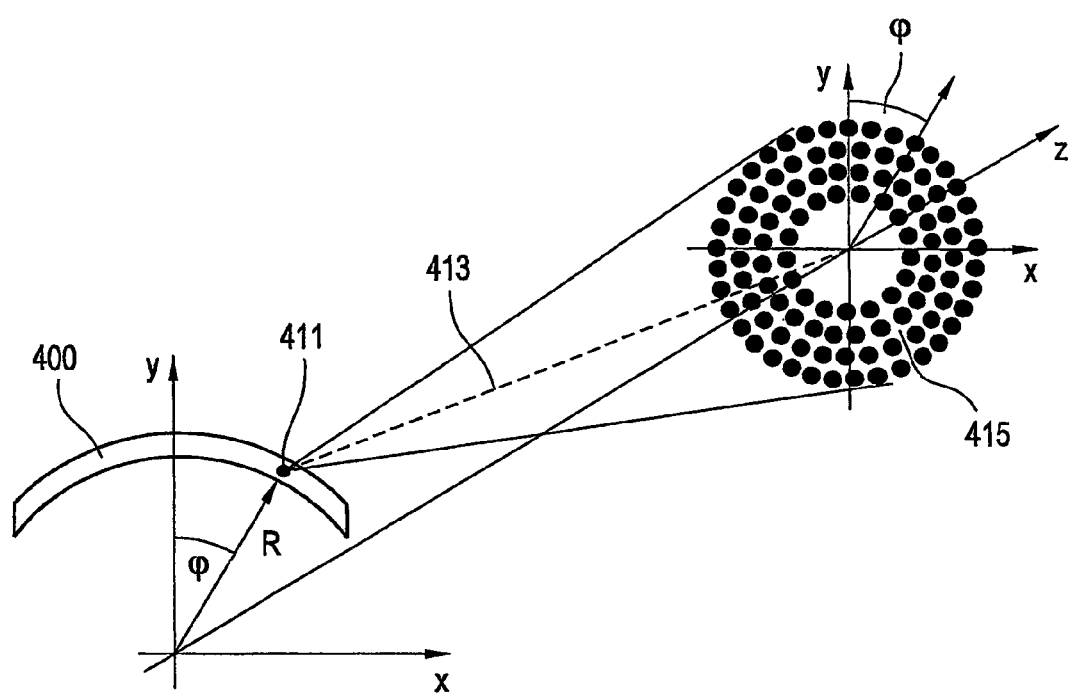
Figure 18A:
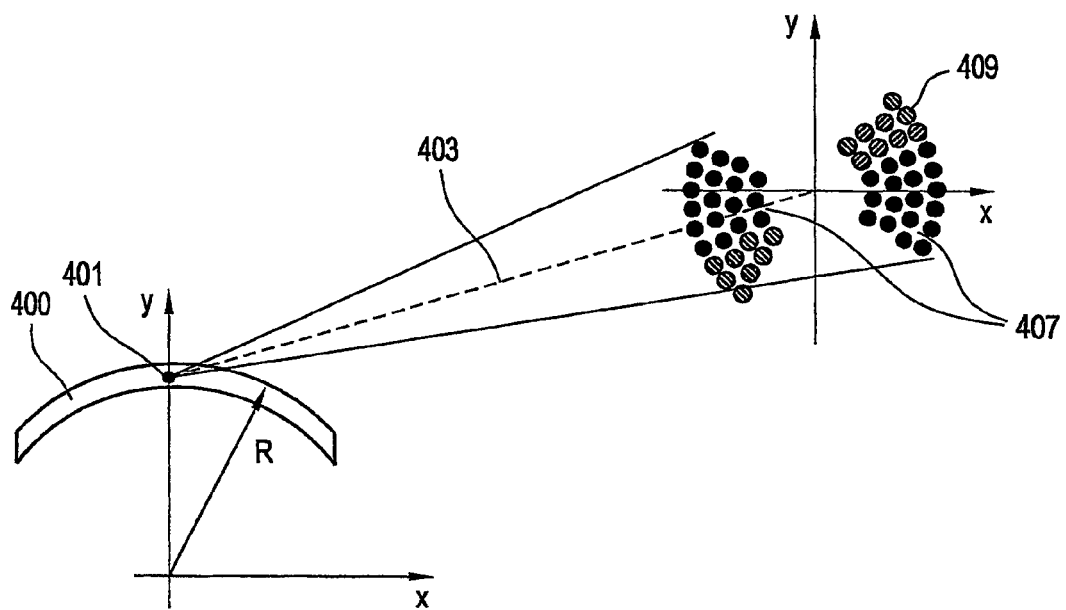
Figure 18B:
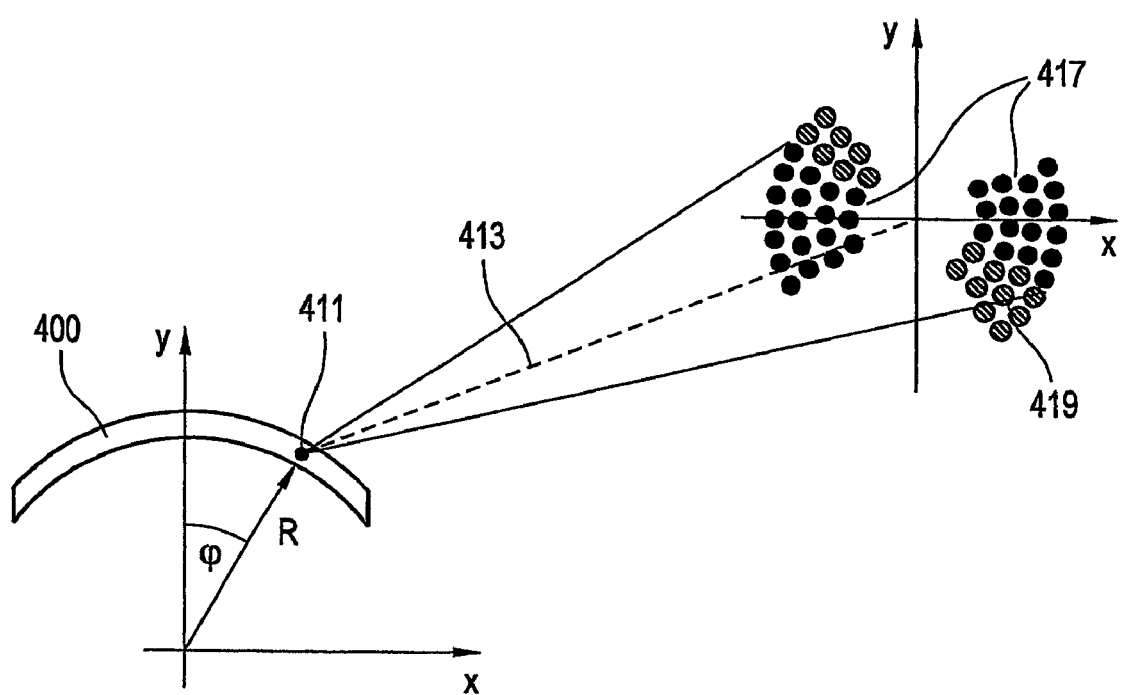
Figure 19:
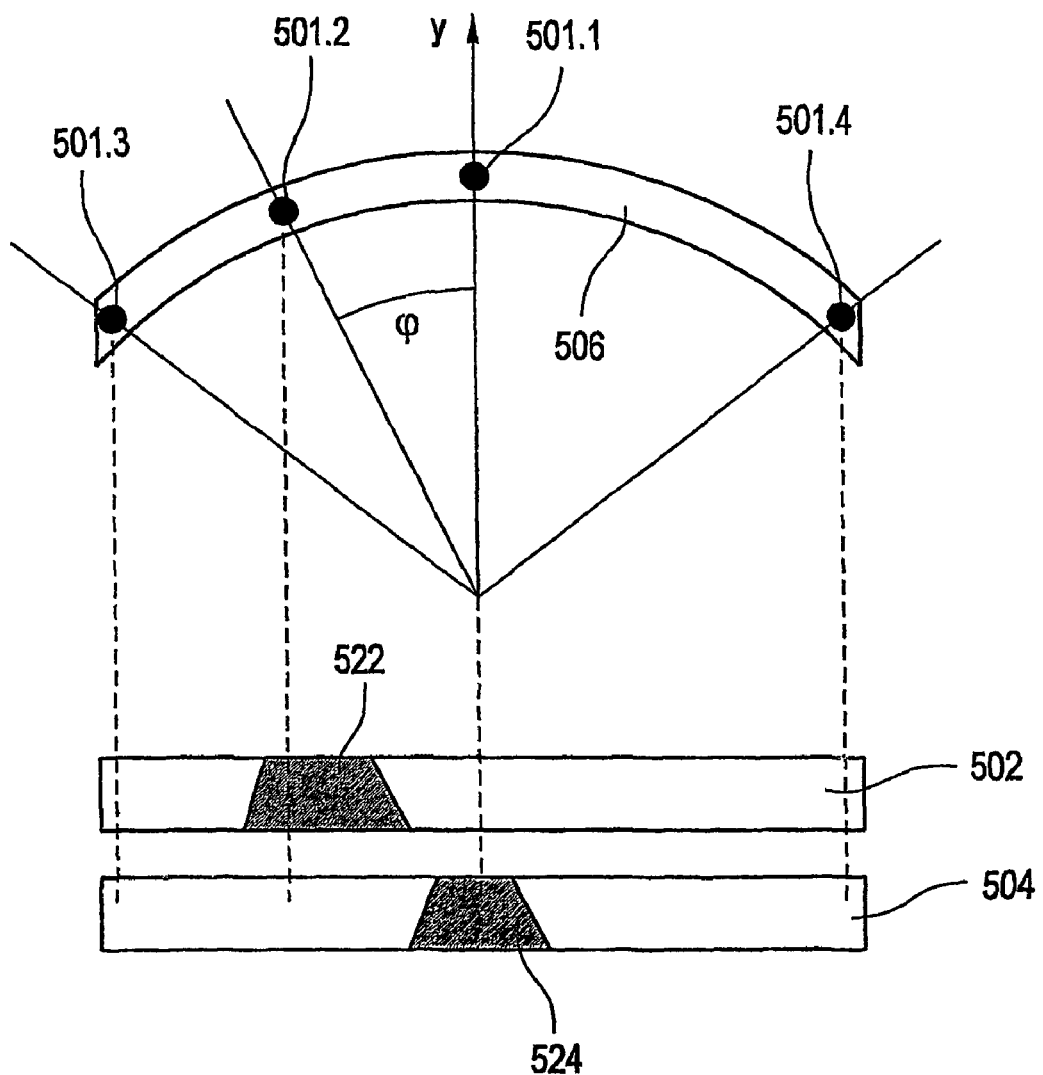
Figure 24:
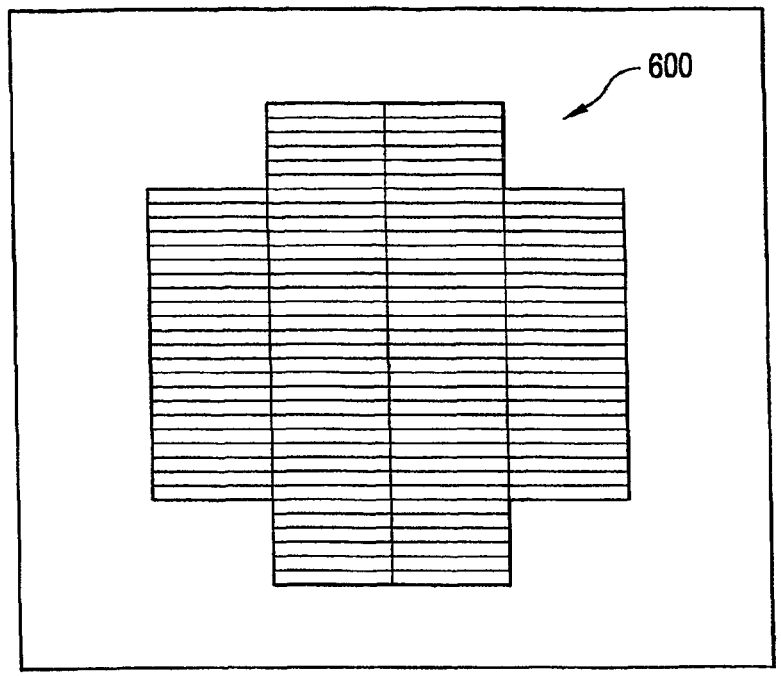
Figure 25:
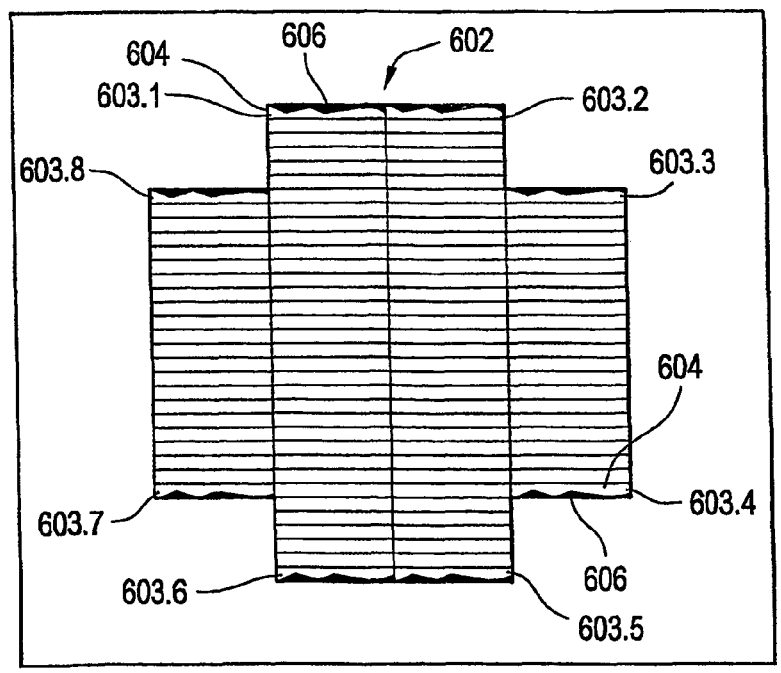

FIGS. 17A to B show structures of exit pupils for annular illumination and different field points of the ring field;

FIGS. 18A to B show structures of exit pupils for dipolar illumination for different field points of the ring field;

FIG. 19 shows a ring field to be illuminated in the field plane with different field points as well as two examples for field raster elements or so called field honeycombs with field diaphragms for setting an illumination setting;

FIGS. 20 to 23 show the structure of exit pupils for quadrupolar illumination for different field points of the ring field;

FIG. 24 shows a diaphragm in front of the field raster elements or so called field honeycombs according to WO 02/27401;

FIG. 25 shows an embodiment of a filter in accordance with the invention with a plurality of filter elements for a first optical element with field raster elements or so called field honeycombs.

The invention relates to an illumination system which provides a pupil which is uniform illuminated with respect to shape and position for each field point of the illumination field. Furthermore the invention provides a homogeneous illumination of a field plane, while providing simultaneously largely constant coherence parameters over the field.

FIGS. 1 to 5 describe arrangements of the filter element on the basis of refractive embodiments. The invention is not limited to the same. It is understood that the person skilled in the art is capable of simply transferring the general principle to reflective systems or hybrid systems, optionally also by using diffractive or holographic-optical elements.

Figure 1:
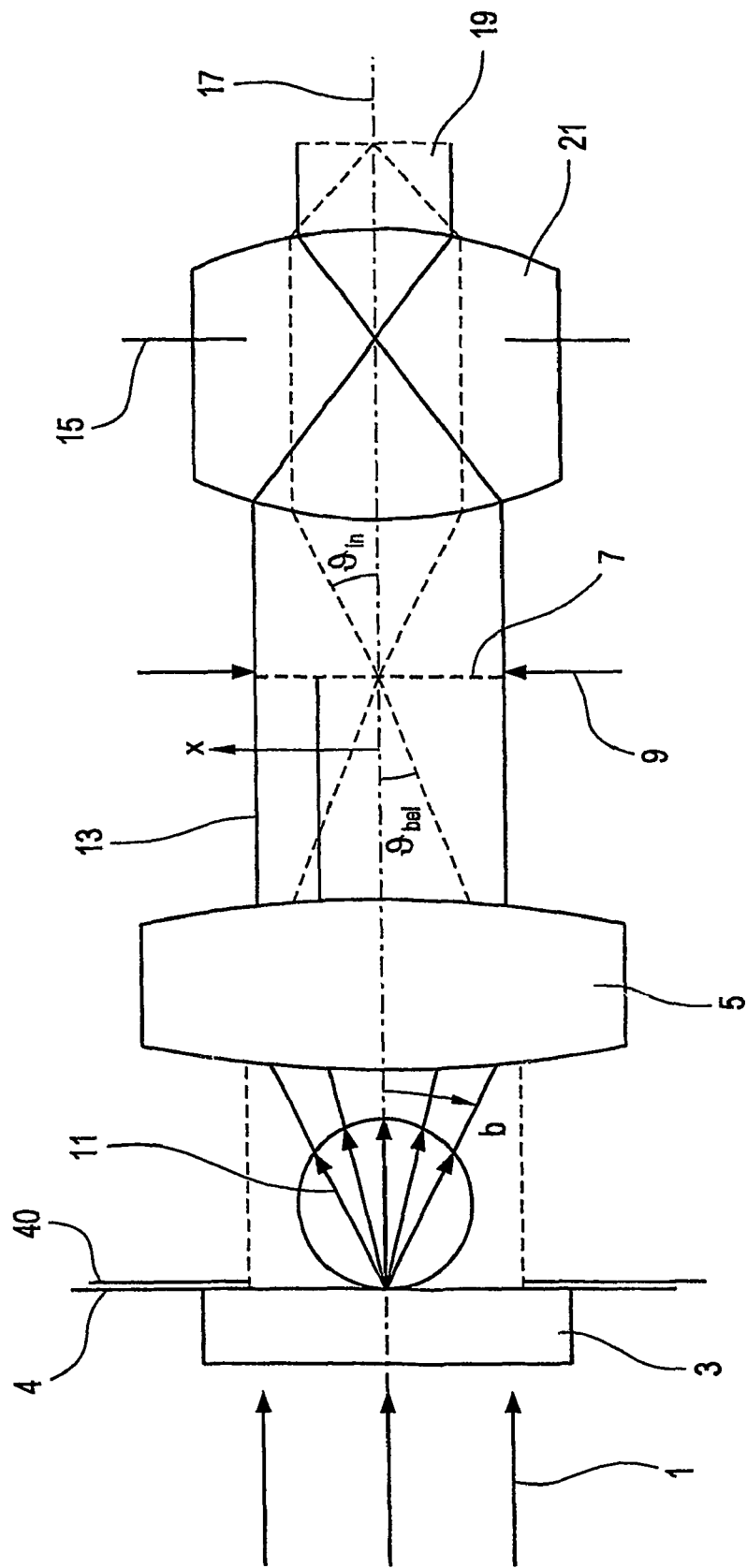
FIG. 1 shows the principal configuration of an illumination system in refractive representation.

FIG. 1 shows the principal arrangement of an illumination system in refractive representation. A light bundle with a light flux 1 originating from the light source falls on an optical integrator which can be arranged as facetted optical element, a so called honeycomb condenser or diffuser. A light with an aperture angle b is produced by the diffuser or honeycomb condenser 3, which aperture angle is chosen in such a way depending on the subsequent optical component which is also designated as condenser lens system 5 that the structure-bearing mask is illuminated in the field plane 9 in a substantially homogeneous manner within a specific region 7. At the same time, at least virtually every field point in the illuminated field 7 is illuminated in a uniform manner from different angles according to the set illumination settings. The illumination setting is set for example in a ray-forming lens system before the diffuser or honeycomb condenser 3 or close to the honeycomb condenser or diffuser 3. FIG. 1 shows an optional diaphragm 40 for setting the numerical aperture $NA_{bel}=\sin \partial_{bel}$ of the illumination system behind the honeycomb condenser or diffuser 3. In the illustrated example, the rear plane 4 of the diffuser or honeycomb condenser 3 coincides with a plane conjugated to the exit pupil of the illumination system (i.e. the so-called conjugated pupil plane) and the optional diaphragm 40 lies in or close to said plane 4.

In a double-facetted EUV illumination system, as is described in U.S. Pat. No. 6,198,793, whose scope of disclosure is fully incorporated herein, the conjugated pupil plane coincides with the plane of the so-called pupil facets or pupil honeycombs of the second facetted element. In the case of honeycomb condensers consisting of field or pupil honeycombs, the pupil facets—as is well known—lie in the exit plane of the honeycomb condenser, i.e. in or close to the plane 4 in FIG. 1.

The imaging of the secondary light sources via a condenser lens system 5 in the entrance pupil 15 of the projection lens 21 which coincides with the exit pupil of the illumination system must be corrected very well. In particular, coma errors must not occur. This is achieved in the case that the optical component sufficiently follows the Abbe sine condition, i.e. it is corrected in an aplanatic way. If the Abbe sine condition were not fulfilled, then this would mean that the imaging scale would not be constant over the angle of radiation, i.e. the pupil would appear differently large for different field points in the field 7 to be illuminated. This would correspond to a σ-variation. An σ-variation is a variation of the divergence angle of the illumination beams on the reticle over the field, with σ usually stating in the case of conventional circular illumination the ratio from the sine of the maximum angle $\partial_{bel}$ of the illumination beams with respect to the optical axis and the sine of the maximum acceptance angle $\partial_{in}$ of the projection lens 21. The maximum aperture angle of the projection lens can also be described by the input-side numerical aperture of the projection lens $NA_{EIN}=\sin \partial_{in}$. The sine of the maximum angle of the illumination beams concerning the optical axis is described by the numerical aperture $NA_{bel}=\sin \partial_{bel}$, which in the present case can be set in an exemplary manner by the diaphragm 40 in the plane 4, so that the following applies: $\sigma=NA_{bel}/NA_{EIN}$. For EUV systems it typically applies that σ=0.5–0.8, with the σ-value being changeable by a variable or exchangeable diaphragm 40 for example and with a σ-variation over the field of approximately 10% for example. In order to obtain increasingly smaller structure widths at low variation of the structure widths over the image field it is necessary that the σ-variation is substantially lower, e.g. less than 2%. In order to remedy the high σ-variation of 10% it is therefore necessary that the condenser lens system 5 behind the honeycomb condenser or diffuser 3 is very well sine-corrected, i.e. it follows the sine condition.

Figure 2:
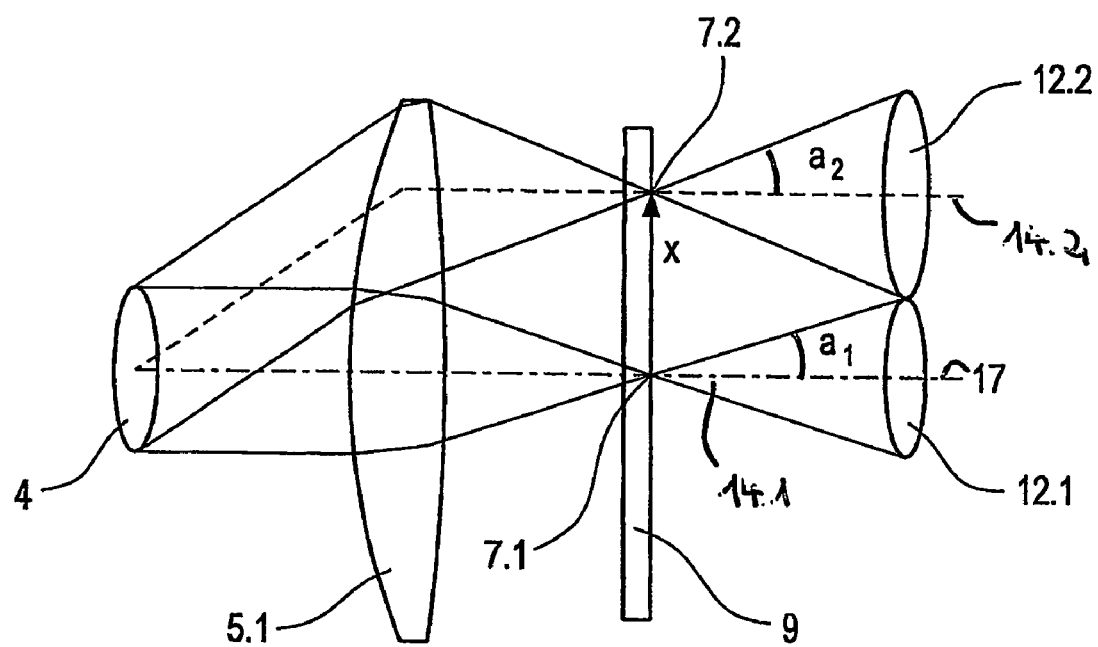
FIG. 2 shows an example for a condenser lens system which is not σ-corrected.

This fact is shown schematically in FIG. 2. The same components are shown with the same reference numerals as in FIG. 1. In FIG. 2 the condenser lens system 5.1 which generally can comprise a plurality of lenses or mirrors—even of aspherical shape—does not meet the sine condition. The illumination beam bundle 12.1 which penetrates a field point 7.1 on the optical axis 17 opens up an aperture angle $a_1$, which is unequal to an aperture angle $a_2$ of an illumination beam bundle 12.2 to a field point 7.2 which has an axial distance. The sigma values $\sigma_1=\sin a_1/NA_{EIN}$ and $\sigma_2=\sin a_2/NA_{EIN}$ thus differ and an σ-variation over the field occurs. The principal ray of the illumination beam bundle 12.1 is designated with reference numeral 14.1 and the principal ray of the illumination beam bundle 12.2 to the field point is designated with reference numeral 14.2. FIG. 2 further shows the plane 4 which is situated in or close to a conjugated pupil plane, the beam angle δ in the conjugated pupil plane and the beam height x in the field plane 9 for a field point having an axial distance such as a field edge point having a maximum height in the X-direction.

Figure 3:
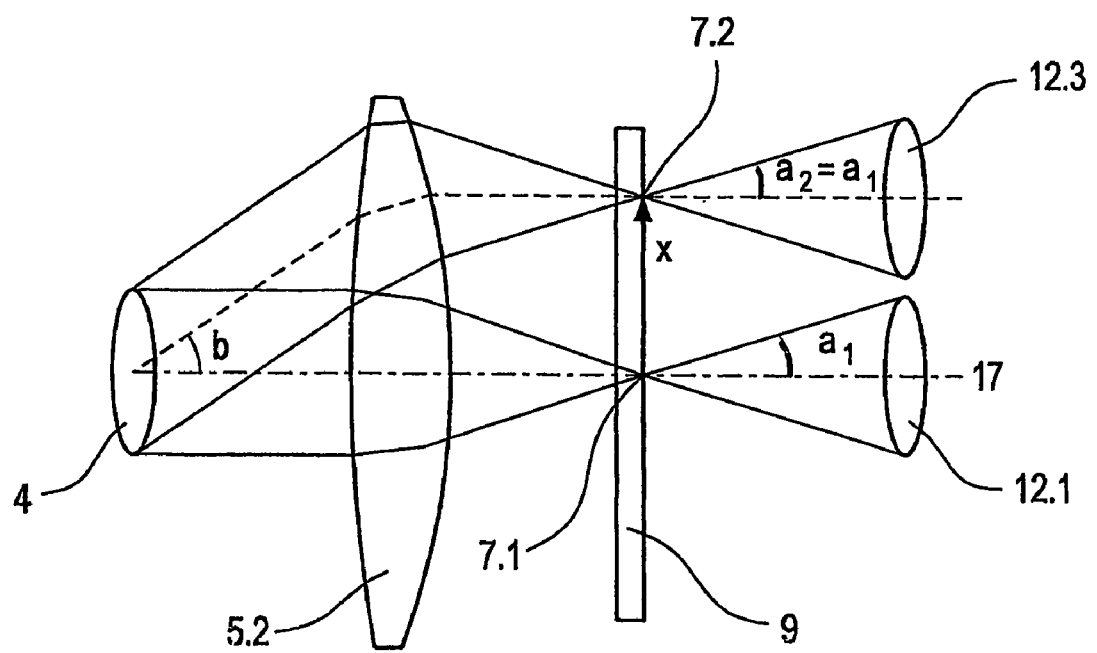
FIG. 3 shows an example for a condenser lens system which is σ-corrected.

FIG. 3 shows the condenser lens system 5 which can generally comprise a plurality of lenses and/or mirrors, even having aspherical shape, which is optimized in such a way that it meets the sine condition. As a result, the illumination beam bundle 12.1 which penetrates a field point 7.1 on the optical axis 17 opens up an aperture angle $a_1$ which is equal to the aperture angle $a_2=a_1$ of an illumination beam bundle 12.3 to a field point 7.2 having an axial distance. In the present FIG. 3, the field point 7.2 having an axial distance is depicted as a field edge point with maximum field height in the X-direction of the field 7 to be illuminated in the field plane 9. Therefore the rays which pass through field point 7.2 all have the aperture angle b relative to the optical axis behind the honeycomb condenser or diffuser, i.e. in the plane 4. The X-direction designates the direction which, in the case the invention is used in a scanning projection illumination system, stands perpendicular to the scanning direction. Thus the scanning direction is along the y-direction. This is shown in an example in FIG. 8. The beam height x in the field plane 9 is again shown for field points having an axial distance.

On the other hand, the homogeneity in the field plane to be illuminated is affected with a sine-corrected lens system because a sine-corrected lens system will lead to a homogeneous field illumination only with Lambert's radiation characteristics 11 of the secondary light source. Although it is possible in the case of any other radiation characteristics to control the homogeneity of the illumination in a plane by means of a deviation from the sine correction and thus to optimize the same, as is disclosed for example by DE 101 38 313 A1 or the U.S. application Ser. No. 10/216,547, as filed with the US Patent and Trademark Office on Aug. 9, 2002, the scope of disclosure of which is hereby fully included in the present application, this homogenization of the illumination generally leads to the σ-variation over the field as described above.

The condition that a homogenized illumination occurs in a condenser lens system only in connection with a Lambert radiator in the strict sense applies only by neglecting reflection and transmission losses. In reality, the ideally desired reflection characteristics of the diffuser or honeycomb condenser 3 can be numerically calculated by reverse beam tracing from the image plane 19. Such numerical calculations are within the field of the knowledge of a person skilled in the art.

In a first embodiment, the diffuser or honeycomb condenser 3 is to be configured in such a way that the radiation characteristics in the plane 4 behind the respective element 3 (under consideration of transmission or reflection losses, if any) corresponds to a Lambert radiator or a respective radiation characteristics, so that in connection with the sine-corrected lens system a homogeneous field illumination is obtained at a field-independent σ-value. For this purpose, the honeycomb condenser could be corrected accordingly by aspherical surfaces for example. This is very cumbersome in production. The production can hardly be achieved with sufficient precision due to the small dimensions of the individual honeycomb condenser elements of a few millimeters.

Diffusers with complex controlled reflection characteristics to ensure that they illuminate a predefined field usually consist (like honeycomb condensers) of individual, repetitive cells which are substantially identical. These elements could also be corrected accordingly. Due to production flaws and the difficulties encountered in production per se, it is also difficult to set the desired radiation characteristics precisely enough as required for projection lithography.

The setting of the illumination of plane 4 purely by optical means such as aspheric or respective elements to obtain the desired radiation characteristics in plane 4 is very difficult because this is susceptible to errors. Any change of the radiation 1 incident upon the diffuser or honeycomb condenser 3 (e.g. in the angle of incidence or the intensity distribution) leads in the case of fixed, inflexible optical elements to a deviation from the desired result, i.e. homogeneous illumination at constant σ-value over the field plane 9 or image plane 19 to be illuminated.

An embodiment of the invention is therefore preferable in which the honeycomb condenser or diffuser 3 is provided with a simple configuration by taking errors into account. These errors are corrected with separate correction elements which optionally can even be adjusted to the respective lens system with its production errors and the incident beam characteristics 1, such that a desired illumination is obtained.

Figure 4:
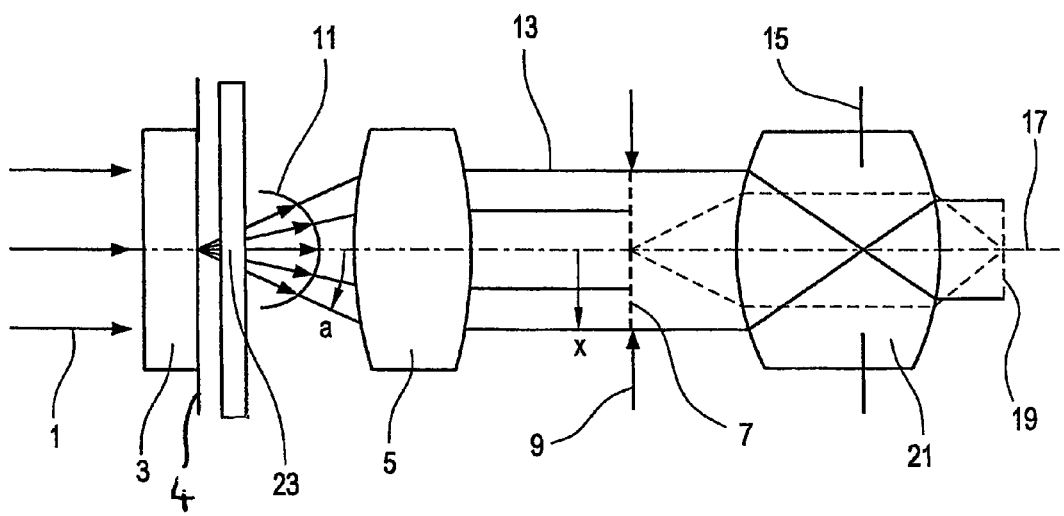
FIG. 4 shows the principal configuration of an illumination system in refractive representation with a correction element in accordance with the invention.

If in the conjugated pupil plane in which the secondary light sources are formed the required angular distribution of a Lambert radiator is not present, it can be set by a correction element such as a filter element 23 according to the invention, as is shown in FIG. 4. In the following figures the same components have the same reference numerals as in FIG. 1.

Figure 5:
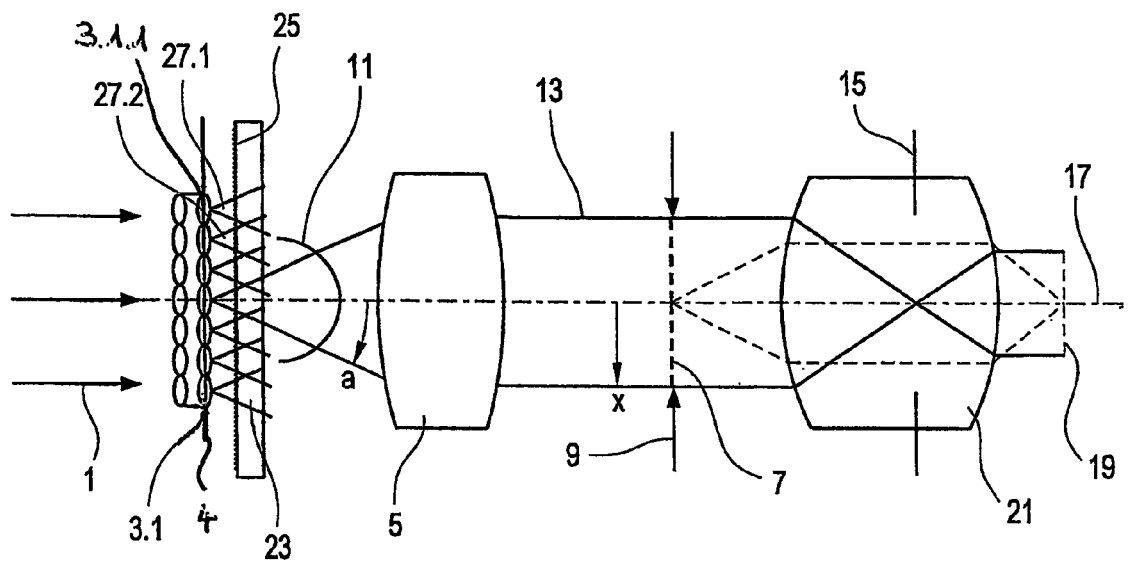
FIG. 5 shows the principal configuration of an illumination system in refractive representation with a correction element in accordance with the invention in the path of the light-rays from the light source to the field plane after the second optical element with second raster elements.

The filter element 23 is preferably not situated precisely in the conjugated pupil plane 4 in which the secondary light sources or the end surfaces of the diffuser or honeycomb condenser 3 come to lie but at a certain distance thereto. As is shown in FIG. 5, the filter element 23 is advantageously situated such, that the individual light bundles 27.1 and 27.2 and the light fluxes which originate from the different second raster elements for example do not yet overlap. In this way it is possible to influence a divergent light bundle as associated to each second raster element or which is present at each pupil honeycomb 3.1.1 of the pupil honeycomb plate 3.1 at a sufficient distance to the focal point of the secondary light source, e.g. by a grey filter, in such a way that a certain angular distribution of the radiation is obtained. The angular distribution is influenced in such a way that depending on the setting made, the most homogeneous possible illumination of the field to be illuminated in field plane 9 is obtained, with the requirements concerning telecentricity being fulfilled.

Telecentricity requirements shall be understood as being the requirements for each principal ray of the illumination associated to a field point in the illuminated region 7 of the field plane 9. The principal ray is the energetic mean over all illumination beams which pass through a field point. Generally, a telecentric beam path in the plane of the substrate to be illuminated is desirable for projection lithography, i.e. in the image plane 19, so that no distortion errors are obtained when the substrate to be illuminated is defocused. This means that in the image plane the principal rays of a light bundle which penetrate an image point should extend substantially parallel to the optical axis, with the deviation being less than 10 mrad for example. To ensure that the principal rays proceed in a telecentric fashion in the image plane they must be set in the field plane to respective angles which can be found easily by reverse beam tracing of the beam bundles through the projection lens 21. A specific distribution of the angles of the principal rays in the field plane 9 is thus obtained which must be produced by the illumination system. For simplicity a telecentric distribution is always also assumed in the field plane in FIGS. 1 to 3. This means that all principal rays of all illumination cones (which are also designated in FIGS. 1 and 2 as illumination beam bundles) also extend in the field plane too to the assigned field points parallel to the optical axis.

Figure 6:
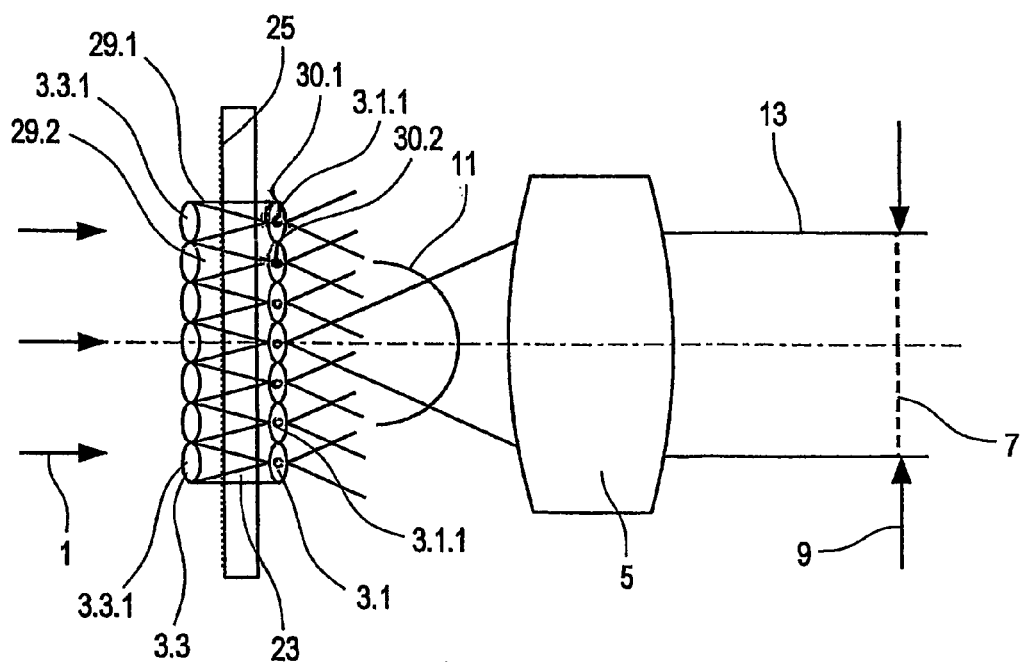
FIG. 6 shows the principal configuration of an illumination system in refractive representation with a correction element in accordance with the invention in the path of the light-rays from the light source to the field plane between the first optical element with the first raster elements and the second optical element with second raster elements.
Figure 7:
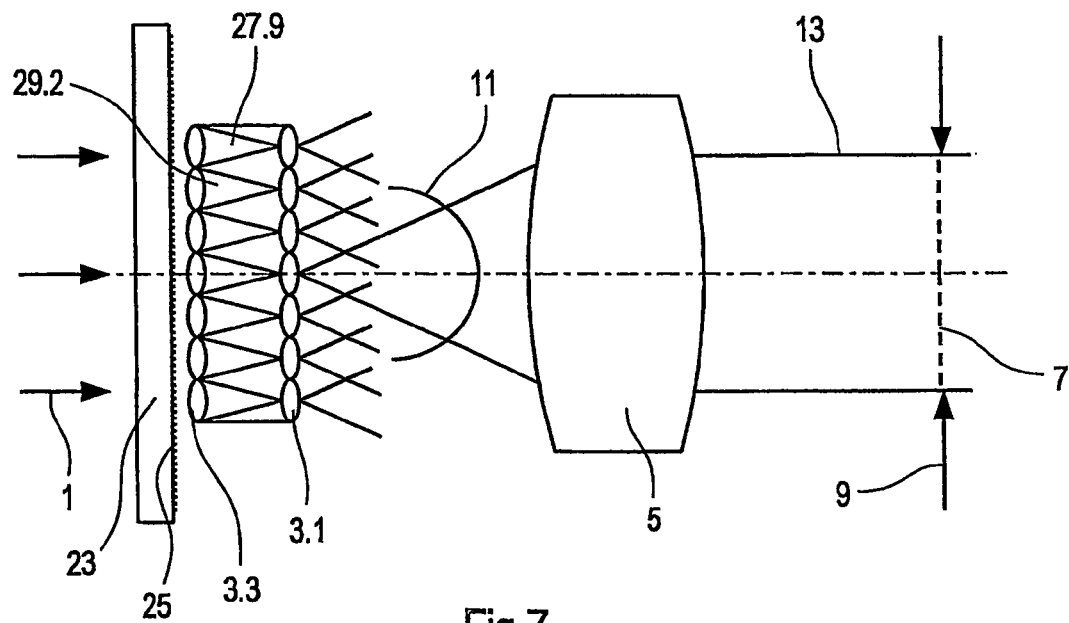
FIG. 7 shows the principal configuration of an illumination system in refractive representation with a correction element in accordance with the invention in the path of the light-rays from the light source to the field plane before the first optical element with the first raster elements.

The radiation characteristics of the optical integrator are influenced with the filter element 23. In the case of a honeycomb condenser with two facetted optical elements with first and second raster elements as an optical integrator, the filter element need not necessarily be disposed behind the second optical element with second raster elements. It can also be arranged between the first optical element with the first raster elements and the second optical element with the second raster elements or before the first optical element with first raster elements. FIG. 6 shows the arrangement between the first optical element 3.3 and the second optical element 3.1 of an optical integrator. The optical integrator consists of a first optical element 3.3 with first raster elements, so-called field honeycombs 3.3.1; and a second optical element 3.1 with second raster elements, so-called pupil honeycombs 3.1.1. The light bundles which originate from each individual field honeycomb 3.3.1 are designated with reference numerals 29.1, 29.2. In or close to the plane in which the second optical element 3.1 with second raster elements 3.1.1 is arranged, secondary light sources 30.1, 30.2 are formed. If the filter element 23 is arranged between first 3.3 and second optical element 3.1, they are mutually spaced. FIG. 7 shows the arrangement of the filter element 23 in the light path of the light source (not shown) before the first optical element 3.3 with the first raster elements, i.e. the field honeycombs.

When a scanning illumination is performed with a projection illumination system for example, it is sufficient for the uniformity of the illumination when the intensity integrated in the scanning direction is substantially homogeneous. Substantially homogeneous shall be understood in this application as deviations from the perfectly homogeneous illumination of less than 0.5% for example. This also allows for example to mask or influence the effective expansion of the field honeycombs in the scanning direction directly before the field honeycombs in such a way that the desired scan-integrated intensity is obtained.

Figure 8A:
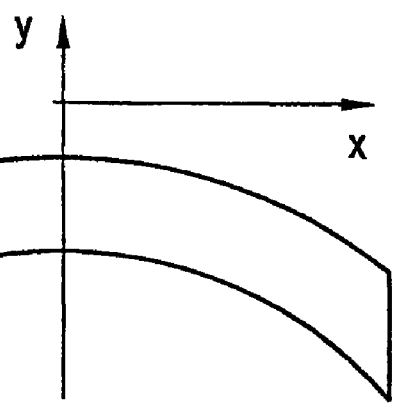
FIGS. 8A to 8B show representations of a ring field to be illuminated in the field plane as well as the plot of the scan-integrated uniformity along the X-axis.

In order to calculate the uniformity in the scanning direction, an illumination of the field plane in the form of a ring field segment is assumed for example, with the scanning direction extending parallel to the Y-direction of the system of coordinates. Such a ring field and the associated coordinates which define the X- and Y-directions are shown in FIG. 8a. The scanning energy (SE) depending on the direction X which is perpendicular to the scanning direction is calculated as follows:

$$SE(x) = \int E(x,y) dy$$

with E being the intensity distribution in the x-y-field plane depending from x and y. If an substantially uniform illumination is to be obtained, it is advantageous when the scanning energy is substantially independent of the x position. The uniformity of the scanning direction is accordingly defined as follows:

$$\text{Uniformity } [\%] = 100\% * (SE_{max} - SE_{min})/(SE_{max} + SE_{min})$$

Figure 8B:
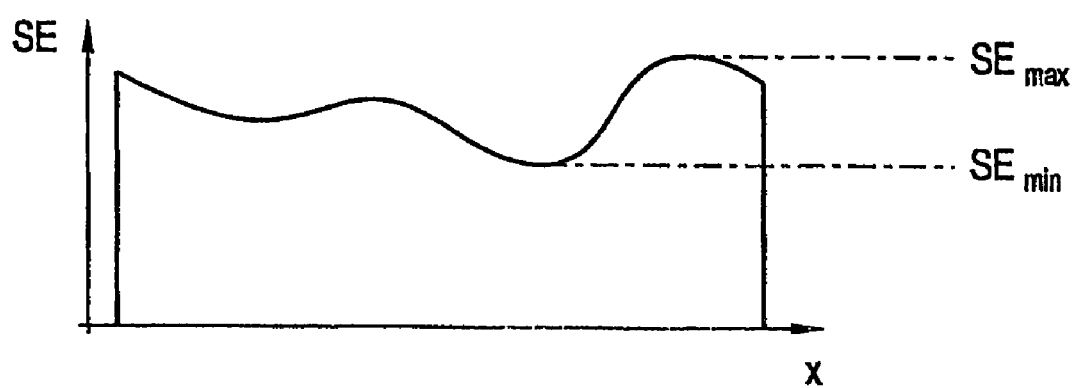

In this case, $SE_{max}$ is the maximum and $SE_{min}$ the minimum scanning energy occurring in the illuminated field region. In FIG. 8b the scan-integrated uniformity is shown in a strongly exaggerated way with $SE_{min}$ and $SE_{max}$ in x-direction.

As already explained above, e.g. in the description of FIG. 5 to 7 the radiation characteristics can be corrected in a location-dependent way in planes between the exact light source images (the so called secondary light sources) in or close to the pupil honeycomb plate 3.1 and the planes in which the light bundles 27.1 and 27.2 of the individual pupil honeycombs 3.1.1 begin to overlap. Thus the radiation characteristics can be influenced. The filter 25 with a plurality of filter elements 23 which are assigned to each channel, i.e. to each secondary light source in a honeycomb condenser and thus to each pupil honeycomb or second raster element, can be arranged for example as described above close before the field honeycombs of the first optical element 3.3 between the honeycombs and up to the vicinity of the pupil honeycombs of the second optical element 3.1 or slightly behind the pupil honeycombs. In a refractive honeycomb condenser the filter is advantageously attached before the field honeycombs or behind the pupil honeycombs. In a reflective honeycomb condenser the filter is advantageously arranged in the light path of the light source (not shown) after the field honeycombs, so that it acts in two ways, namely in the incident and the reflected beam path. This leads to the advantage that the light bundles 29.1, 29.2, 27.1, 27.2 which are assigned to the individual honeycomb channels, which are formed between the field honeycombs of the first optical element 3.3 and the pupil honeycombs of the second optical element 3.1, and after the pupil honeycombs of the second optical element 3.1, do not overlap. Therefore the radiation characteristics can be controlled in an optimal manner.

When the imaging setting, i.e. the degree of coherency σ of the imaging is changed, which means that the illumination of the exit pupil of the illumination system is changed, it may be necessary for producing a homogeneous illumination to adjust the filter. For this purpose it is advantageous when several filters for specific settings are made available via a changer. The filters can be adjusted to a respective illumination device, i.e. in an individual way also to the production tolerances of a honeycomb condenser or the anti-reflection coating of a multi-layer coating for example. If it is determined after the mounting of the illumination system for example that the illumination in the field plane deviates from the desired homogeneity as forecast by calculations, the desired homogeneity can be set retroactively by the filter in accordance with the invention by correction or respective adaptation of the filter element. For this purpose one starts from the measured homogeneity distribution and determines a respectively higher density of the transmission filter at the points in the filter which are conjugated to a field point, which is swamped out.

The exchange of the filters also allows in principle to set different settings directly. This entails a loss of light, however.

Figure 9:
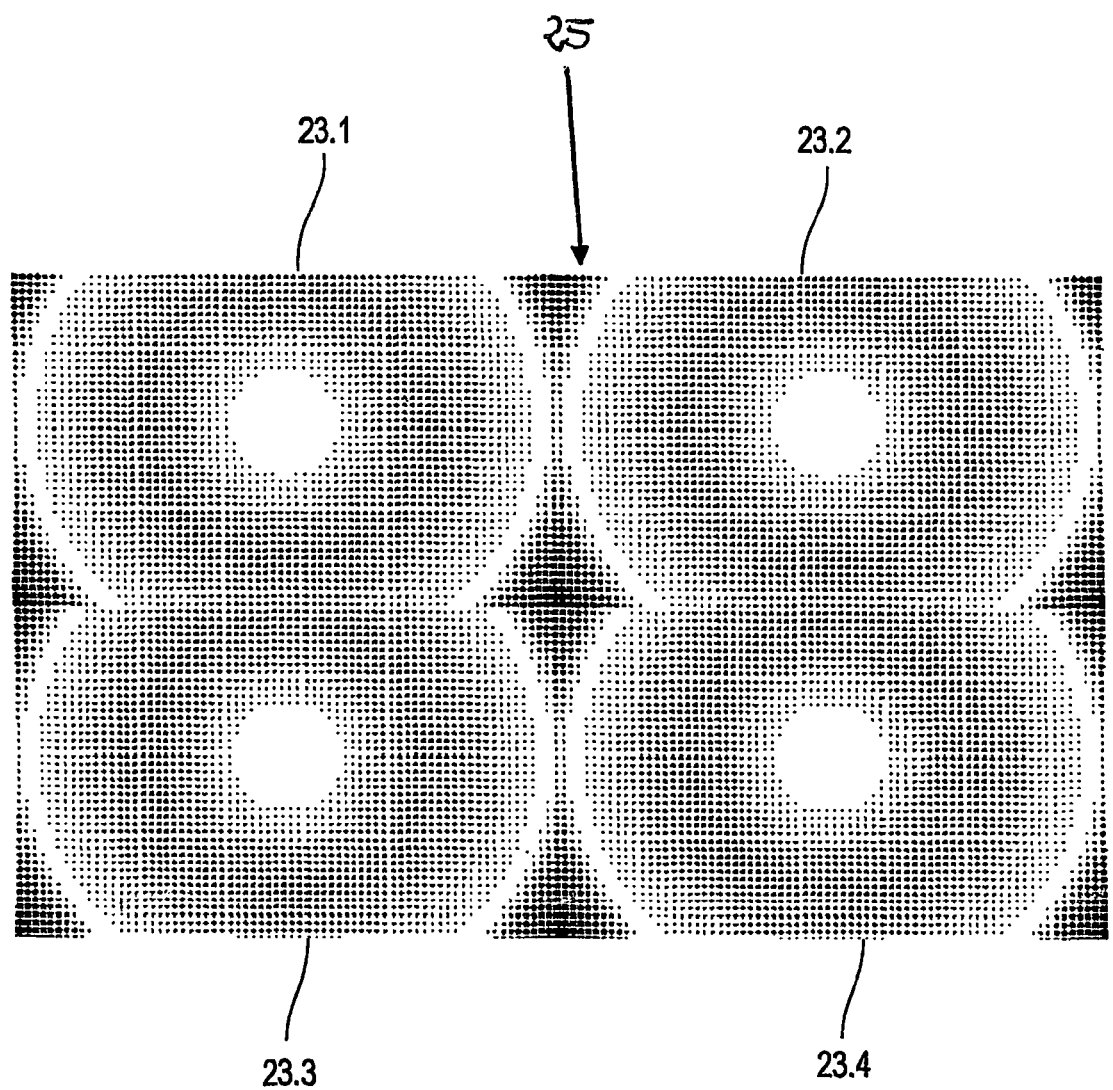
FIG. 9 shows an exemplary filter with four filter elements for four light channels —so called honeycomb channels—for arrangement in the light path after the second optical element with second raster elements.

FIG. 9 shows the example of a filter 25 shown in FIG. 5 to 7 in greater detail for a certain illumination setting, e.g. a conventional setting with several filter elements 23.1, 23.2, 23.3, 23.4 for an arrangement behind the pupil honeycombs. In an exemplary way, four rectangular regions for four channels of a honeycomb condenser are shown in which a rotationally symmetrical transmission distribution is set. The transmission is configured in a variable way, e.g. via a chromium coating either with variable thickness or (as is shown) in a rastered manner, as in printing technology. Each segment of the four segments shown in extract corresponds to a honeycomb channel or light channel or a light bundle as shown in FIG. 5 to 7 which originates from a secondary light source as shown in FIG. 5 to 7 which is formed by a first optical element with first raster elements. The filter substantially consists of the same filter elements for the four shown honeycomb channels. This filter it would be suitable to correct a large deviation from the Lambert characteristics which is caused by the respective design. Design errors are errors due to the fact, that the individual honeycomb lenses or mirrors are not aspherical as a result of production, but are designed in a spherical way or the optical surfaces of all channels are designed in a similar way and the optimization of the individual channels is omitted.

Figure 10:
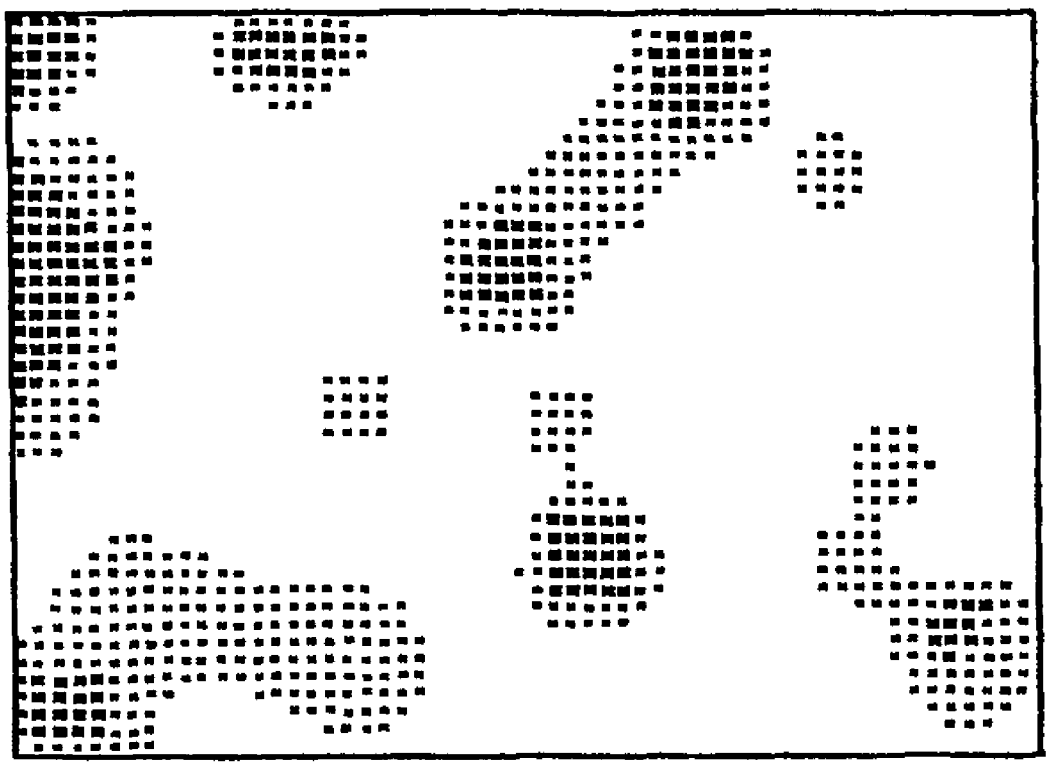
FIG. 10 shows an exemplary filter for a light channel—a so called honeycomb channel—for the correction of location-dependent production faults.

FIG. 10 on the other hand shows an example of a filter for a honeycomb channel which corrects production errors of a single honeycomb channel in a location-dependent way, so that a homogeneous illumination of the field 7 is obtained in the field plane 9 for this honeycomb channel. Production errors can be due to surface defects, coating errors, adjusting errors and deviations from the ideal geometrical shape of the field honeycombs for example. Such a filter could be calculated for example subsequently from the measured uniformity error in the field plane 9 or in the image plane 19 and be introduced into the illumination system. This filter which substantially corrects production errors can be combined with the aforementioned filter which corrects design errors, so that only one filter needs to be used. A different progress of the correction filter element in FIG. 10 can be obtained for each honeycomb channel as a result of production tolerances. The transmission can be arranged through a chromium coating either with variable thickness or (as shown) in a rastered manner, as in printing technology.

Figure 11:
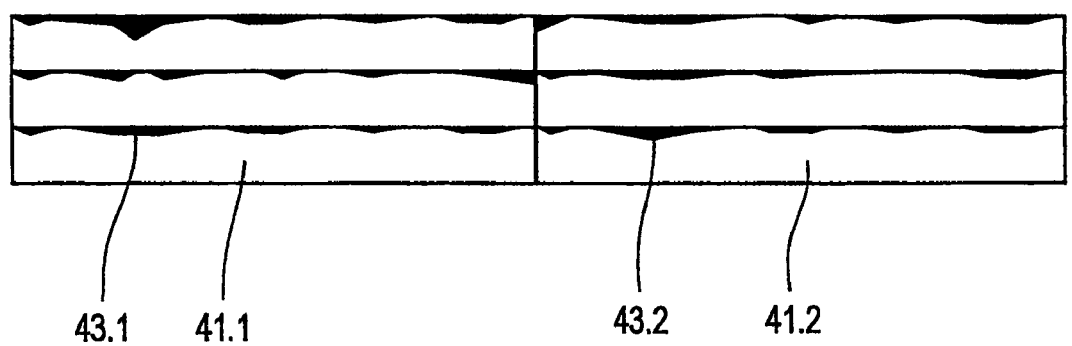
FIG. 11 shows a filter with six filter elements for six light channels—so called honeycomb channels—for arrangement in the light path from the light source to the field plane to be illuminated before the first optical element with first raster elements.

FIG. 11 shows a filter for a random setting which is arranged before the first optical element 3.3 shown in FIG. 5 to 7 with field honeycombs. The filter is shown by way of example with six filter elements for six honeycomb channels, i.e. six light channels which are made available by the optical integrator whose expansion in the scanning direction are varied by diaphragms. The different diaphragms 43.1 and 43.2 for the field honeycombs 41.1 and 41.2 are shown by way of example. It is not necessary that a filter element in accordance with the invention is attached in front of all field honeycombs. A lower number of filter elements is usually sufficient in order to achieve the required uniformity error correction. If there is a uniformity error of 10% as a result of a deviation from the Lambert characteristics, then it is sufficient to shadow off 40 of 100 honeycomb channels in a selective way, i.e. in a field-height-dependent manner in order to obtain less than 0.5% of uniformity error of the scan-integrated uniformity. As a result of the filter element of the respective honeycomb or light channel, the intensity of the light of the light channel is reduced after the filter element by the introduced diaphragms 43.1, 43.2 for example. This is clearly shown in FIG. 11. This reduction of the light occurs in a location-dependent way, i.e. the light of the light channel which illuminates a surface of the filter element is reduced at different places of the illuminated surface area differently, e.g. completely in the region of the diaphragms and not at places at which diaphragms have not been provided in the light channel. The reduction is therefore location-dependent. In the case of a transmissive filter element such as a grey filter as shown in FIG. 9 or 10, the transmission and thus the reduction can be set variable in a range of 0% reduction to 100% reduction in a location-dependent way.

Instead of diaphragms which after projecting the transmitted radiant flux in the field plane 9 of the illuminated region 7 (e.g. a ring field as shown in FIG. 8a) correct the scan-integrated uniformity in the scanning direction, i.e. the y-direction of the illumination, it is also possible to attach a filter with filter elements which corrects the homogeneity of the illumination (e.g. of a ring field in the field plane 9) via the transmission. Diaphragms would be the solution of choice in the case of mirror systems as used in EUV-lithography for example. Transmissive filter elements are a preferred option in the case of longer wavelengths, e.g. 157 nm or 193 nm.

FIGS. 9 and 10 show an example for a filter with transmissive filter elements. FIG. 11 shows an example for a filter which is composed of filter elements with diaphragms. As is shown from the description of FIG. 11, it is sufficient to attach the diaphragms merely in front of the field honeycombs in order to achieve a sufficient scan-integrated homogeneity of the illumination.

Whereas filter elements were described up to this point which are designed statically, i.e. the filter elements are designed in such a way that they correct production errors for example, it should be noticed that the invention is not limited to this.

It would also be possible to provide active filter elements which can be introduced in addition to the static filter elements. Such active filter elements comprise an active component with which the light intensity can be reduced from a honeycomb channel which is formed between the first raster element and the second raster element, ranging for example up to complete shadowing. Such active components are advantageously designed in such a way that the light intensity is reduced in a variable way at the edges of the individual first raster elements which are also designated as field honeycombs. By this typically occurring excesses of the flux density in the plane to be illuminated, i.e. the so-called field plane can be reduced or even fully avoided. Active components of such an active filter element are elements for example which produce shadowings such as wires which are movable or variable in their thickness. Comb diaphragms which are rotatable into the beam path or electrooptical components with variable transmission or reflection would also be possible.

The uniformity of the illumination in the field plane can be corrected variably with the help of transmission filter elements which are movable behind the second optical raster elements (i.e. the pupil honeycombs) in the direction towards the optical axis when there is a predominant excess of the illumination at the field edge. The filter similar to the filter of FIG. 9 is moved into the divergent bundles of rays in the z-direction in such a way that it either sits close to the pupil honeycombs and the bundles of rays are allowed to pass unhindered only through the middle region of the filter elements 23.1 to 23.4, or it is spaced at a distance, so that the bundles of rays widen sufficiently wide behind the secondary light sources and are reduced at the edge by the filter elements 23.1 to 23.4.

Figure 12:
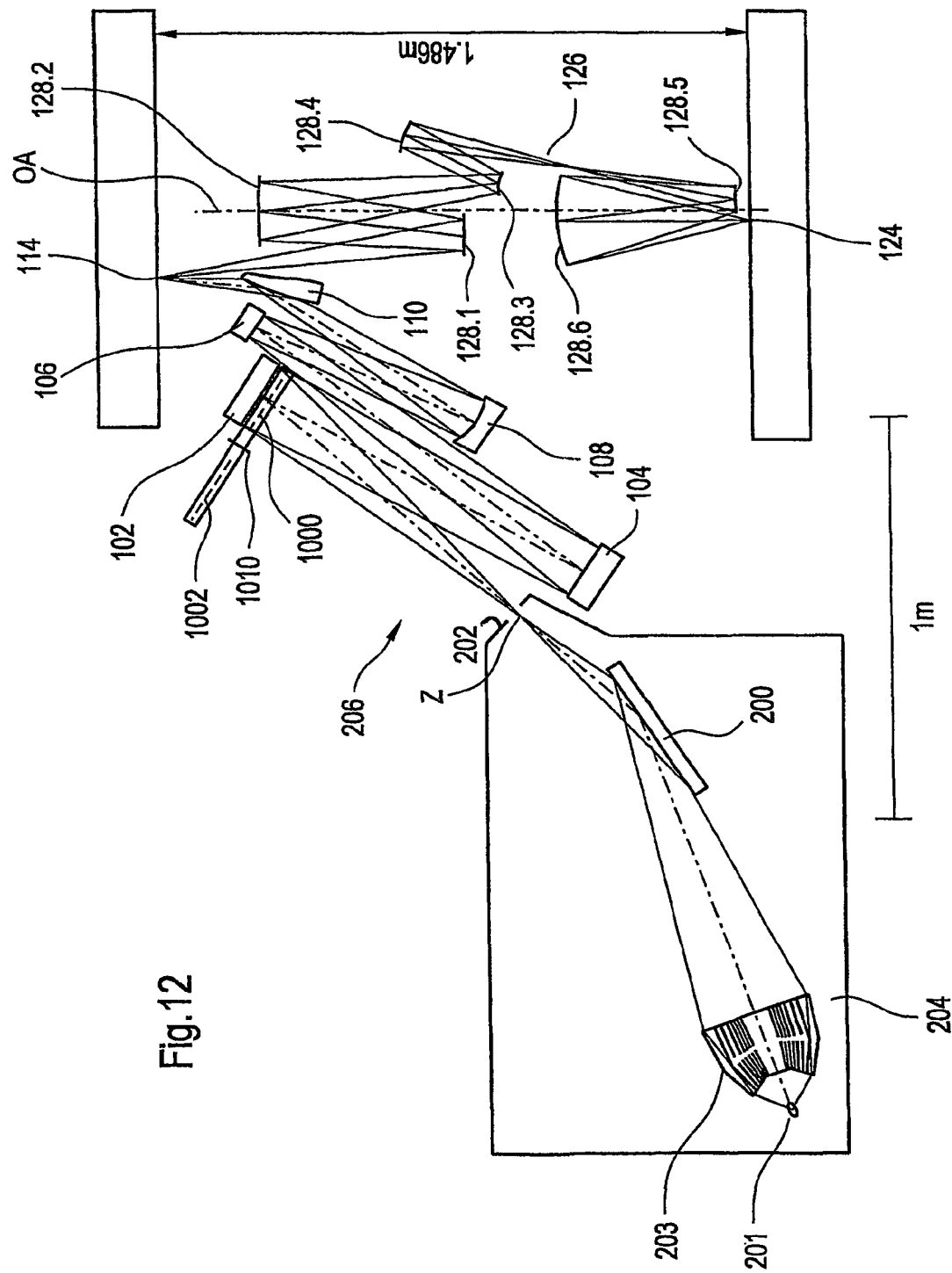
FIG. 12 shows an exemplary configuration of a projection illumination system, especially for microlithography.

FIG. 12 shows an example of an EUV projection illumination system as is shown in PCT/EP/02/00608 for example, whose scope of disclosure is hereby fully incorporated in the present application.

The EUV projection illumination system according to FIG. 12 comprises an illumination system 206 with a diffractive spectral filter 200 which is realized by a grating for example. Together with the diaphragm 202 in the vicinity of the intermediate image Z of the light source 201, undesirable radiation with wavelengths for example which are substantially higher than the desired wavelength (which in the present case is 13.5 nm) can be kept from entering the part of the illumination system which is situated behind the diaphragm 202.

The diaphragm 202 can also be used to spatially separate the light source 1 with the space 204, a collector 203 as well as the grating 200 from the downstream illumination system 206. When both spaces are separated by the introduction of a valve close to the intermediate focus Z, a separation by pressure is also possible. A spatial and pressure separation can prevent debris from the light source to reach the illumination system situated behind the diaphragm 202.

The illumination system as shown in FIG. 12 comprises a nested collector 203 with eight mirror shells. The first optical element 102 comprises 122 first raster elements with an extension of 54 mm×2.75 mm each. The second optical element 104 comprises at least 122 second raster elements which are associated with the first raster elements and which have a diameter of 10 mm each. The correction element corresponding to e.g. the filter element described with reference to FIG. 5 to 7 and in greater detail in FIG. 11 in accordance with the invention is designated with 1000 and arranged directly before the first optical element 102 with first raster elements. The correction element is situated for exchange in a filter wheel with other correction elements 1002 for other imaging settings. The filter wheel can be rotated about a rotation axis 1010. The configuration as a filter element with an active component (as described above) is possible. In the illustrated embodiment, the correction element 1000 is situated in front of the first optical element with raster elements. This is advantageous, but in no way mandatory. Configurations after the second optical element 104 with raster elements or between the first and second optical element 102, 104 with first or second raster elements as shown in FIG. 5 to 7 would be possible. In the case of reflective systems as shown in FIG. 12, the provision of the filter element in close vicinity of the facetted optical elements 102 or 104 is advantageous.

The second raster elements of the second optical element 104 are projected through the mirrors 106, 108 and 110 into the entrance pupil E of the downstream projection lens 126 with six mirrors 128.1, 128.2, 128.3, 128.4, 128.5, 128.6. The projection lens 126 projects the ring field in the object plane 114 into an image field in an image plane 124 in which the object to be illuminated is situated. The structure-bearing mask is arranged in the object plane 114.

The field forming mirror 110 of the illumination system for forming the ring field in the object plane 114 consists of an off-axis segment of a rotational hyperboloid.

The system as shown in FIG. 12 is designed for a field radius of R=130 mm at an illumination aperture of NA=0.03125 in the object plane 114, i.e. on the reticle, according to a filling ratio of σ=0.5 in the entrance pupil E of a downstream 4:1 projection lens with an aperture of NA=0.25 in the plane 124 of the object to be illuminated.

Whereas the projection illumination system as shown in FIG. 12 projects the field honeycombs of the first optical element directly into the field plane in which the object to be illuminated (e.g. the reticle) is arranged for example; projection illumination systems are also possible in which the first raster elements, which are also designated as field honeycombs, are projected at first into an intermediate image and thereafter into a field plane in which the reticle is disposed by means of a lens system situated in the beam path. Such an illumination system is known from WO 01/09681 whose scope of disclosure is fully incorporated in the present application.

Figure 13:
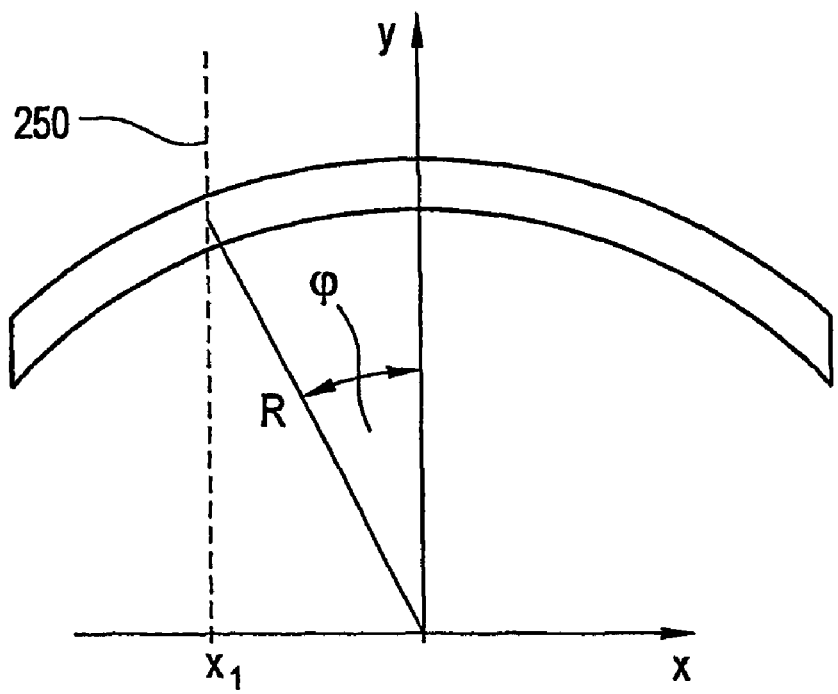
FIG. 13 shows a field to be illuminated in a field plane. Furthermore shown is a scanning path.
Figure 14:
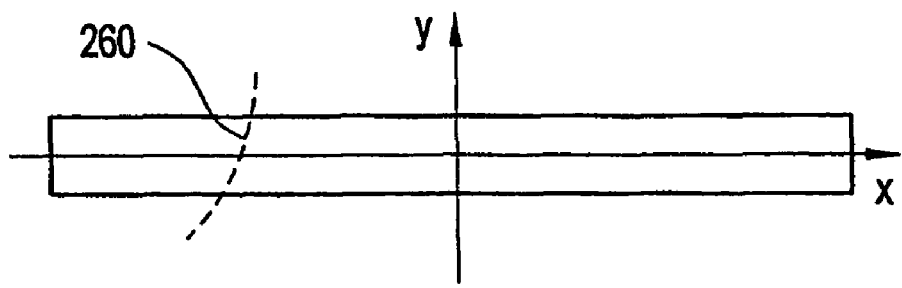
FIG. 14 shows an individual field honeycomb. Furthermore shown is a scanning path.

FIG. 13 shows the field 7 to be illuminated in the field plane 9 or 114 of a scanning projection illumination system as shown in FIG. 5 to 7 or FIG. 12. The scanning direction is the y-direction. The intensity $SE(x) = \int SE(x, y) dy$ over the field, which intensity is integrated in the y-direction, corresponds to the scan-integrated intensity. A line 250 is represented in the scanning direction for a field height $x_1$. If one wishes to reduce the scan-integrated intensity $SE(x_1)$ for this field height $x_1$, it is necessary to reduce the transmitted power by the filter in accordance with the invention on the field honeycombs along the conjugated scanning paths, so that a desired scan-integrated intensity $SE(x_1)$ is obtained. FIG. 14 shows the conjugated scanning path for the field height $x_1$ as chosen for FIG. 13 which is projected into the field plane 9 or 114 of FIG. 5 to 7 or 12. The scan-integrated intensity $SE(x_1)$ can be reduced by a suitably arranged diaphragm for example in order to reduce the scan-integrated light power and to thus correct a homogeneity error. The shape of the diaphragm along the conjugated scanning direction 260 on the field honeycomb (as shown in FIG. 14) determines the illumination of the field plane in the scanning direction 250 for a channel 27.1, 29.1, e.g. of a double-facetted illumination system with a first and second facetted optical element. If there is an optical system with 122 field honeycombs for example, i.e. 122 channels for example, it is only possible to correct a maximum of approx. 1% of the scan-integrated uniformity on a field honeycomb via a diaphragm. For this purpose it would be necessary to stop down the complete field honeycomb. This would have an influence on the illumination setting, however. It is therefore advantageous to distribute the correction of the scan-integrated uniformity evenly over many field honeycombs whose associated pupil honeycombs illuminate the exit pupils as symmetrically as possible, so that the filter does not have any influence on the principal ray of the illumination or the telecentricity in the image plane 17.

Figure 15:
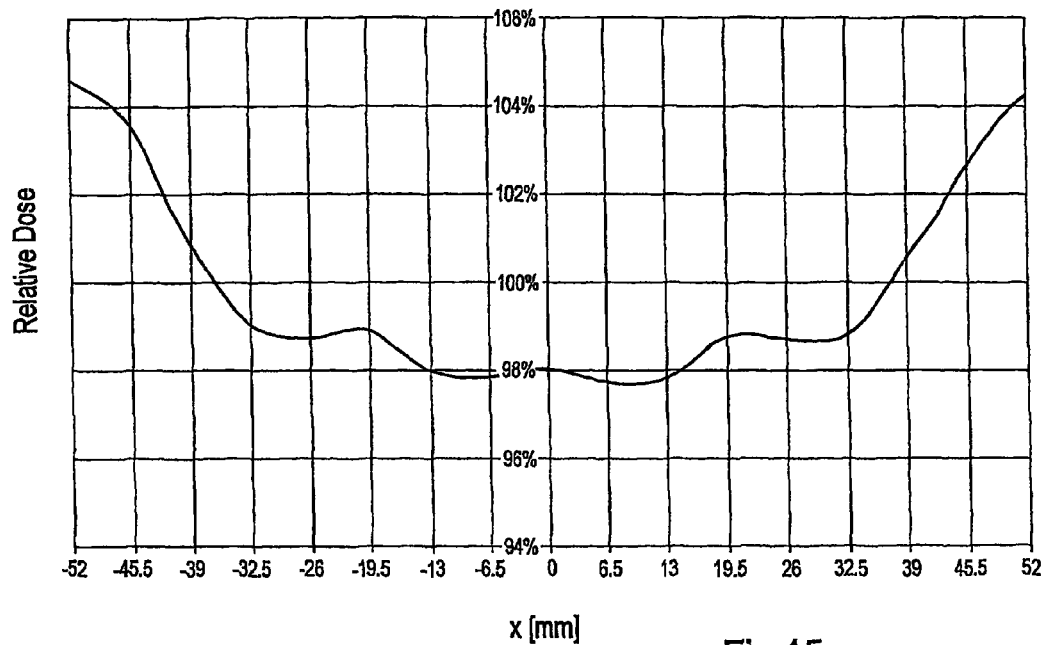
FIG. 15 shows the scan-integrated uniformity in the field plane of a system according to FIG. 12 without correction element.

FIG. 15 shows an example of a scan-integrated intensity SE(x) depending on the field height x for an EUV projection apparatus according to FIG. 12 without correction element 1000. The minimum scan-integrated intensity $SE_{min}$ is 97.7%, the maximum scan-integrated intensity $SE_{max}$ is 104.6% within the field to be illuminated up to a height of x=±52 mm. The uniformity error is for this $\Delta SE = (SE_{max} - SE_{min})/(SE_{max} + SE_{min}) \approx 3.4\%$.

Figure 16:
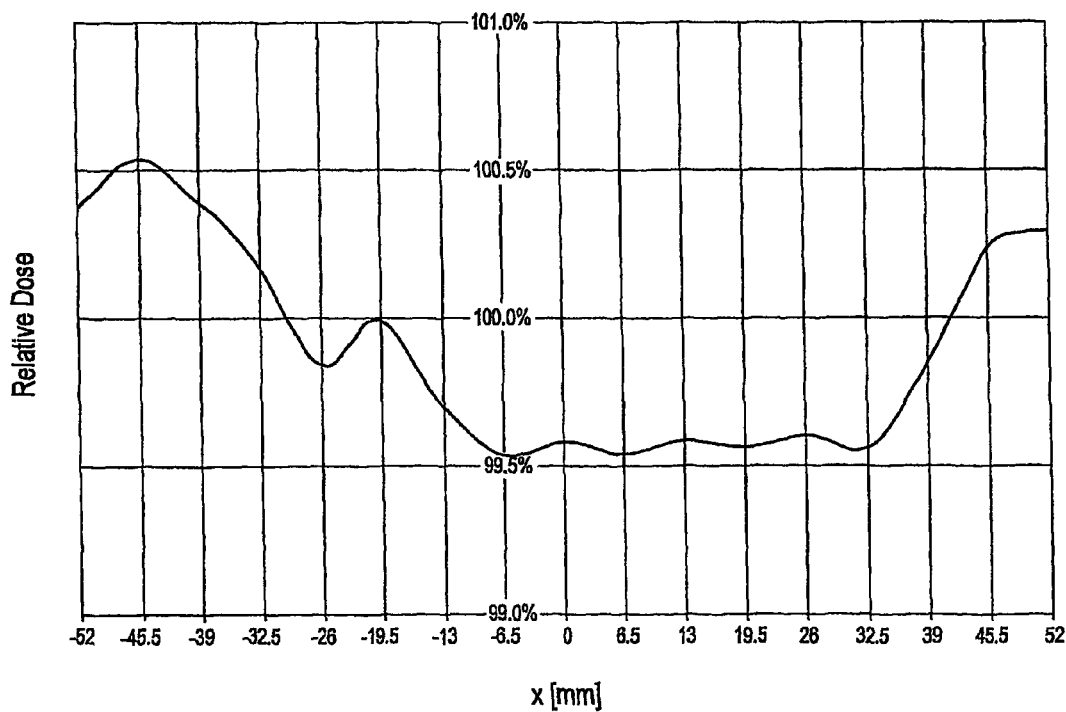
FIG. 16 shows the scan-integrated uniformity in the field plane of a system according to FIG. 12 with a correction element according to the invention.

FIG. 16 shows the uniformity in the field plane which is achieved when using a correction element 1000 as shown in FIG. 12 with filter elements before the field honeycombs. The uniformity error is corrected to better than 0.5% by the filter in accordance with the invention without thus influencing the telecentricity properties of the illumination settings. In this example, the filter has the shape of the filter as shown in FIG. 11 with filter elements with diaphragms which are disposed in front of the field honeycombs of a EUV-projection apparatus as shown in FIG. 12. For this purpose, the homogeneity of the illumination without filter was determined at first in the image plane 17 or 124. Then 28 of the 122 field honeycombs were chosen. The respective shape of the diaphragms for trimming the illumination in the image plane was determined in the manner as shown and described with respect to FIGS. 13 and 14. The course of the irradiance caused by the source and the collector lens system incident upon the honeycomb plate was taken into account. In order to correct the 3.4% of uniformity error it is sufficient to shadow off from the chosen 28 field honeycombs only a maximum of 15% of the surface illuminated by the field honeycombs on the filter elements in order to obtain less than 0.5% uniformity error. The residual error in FIG. 16 is substantially the result of the calculation precision and can be further reduced by iteration of the process as described above.

If the field forming for a ring field occurs through an optical component with an anomorphic field mirror (e.g. a field-forming grazing-incidence mirror 110 as described in the embodiment in connection with FIG. 12), it is necessary to ensure that there is no offence against the sine condition at least in the radial direction. In the azimuthal direction it is necessary to ensure that (for a field point) the conjugated pupil points all rotate by the same angle, i.e. the pupil must rotate uniform during the condenser imaging, thus avoiding any unevenness in the illumination of the pupil. This is shown in the FIGS. 17a to b and 18a to b. FIGS. 17a and 17b show an annular illumination. In contrast thereto FIGS. 18a and 18b show a dipolar illumination.

Within the illumination system with ring field formation via an anomorphic projection (e.g. by means of a field-forming grazing-incidence mirror) there is no plane which is optically precisely conjugated to the exit pupil. This is due to the optical effect of the optical component with anomorphic effect, e.g. the grazing-incidence mirror 110 in FIG. 12 which is close to the field and which is used for forming the ring field. If an isolated field point is considered, then the grazing-incidence mirror close to the field performs a stigmatic projection of the secondary light source points in the vicinity of the pupil facet mirror into the exit pupil of the illumination system. In order to ensure that the illumination of the pupil is stationary (i.e. the principal ray, the diameter and the homogeneity of the illumination are identical for every field point of the field to be illuminated in the field plane and the σ-value for example thus does not change over the field), the sine condition must be fulfilled in the radial direction (i.e. in the r-direction of the pupil plane). The exit pupils are then obtained by a simple rotation for different field points. As is shown in FIG. 17b, the angle of rotation of the pupil is preferably identical with the azimuth angle of the field point 411 in the field plane 400. The pupil illuminations 405 and 415 as shown in FIGS. 17a and b correspond to an annular illumination setting. Since the pupils for different field points 401 and 411 which differ by an angle φ are obtained by rotating about the angle φ, the illumination setting as shown in FIGS. 17a and 17b is field-independent.

The principal rays 403 and 413 extend between the field points 401 and 411 and the intersection points of the Z-axis with the pupil plane with annular illuminations 405 and 415. The field point 401 in FIG. 17a denotes the central field point (0,0) and field point 411 denotes an off-axis field point in FIG. 17b.

By fulfilling the sine condition only in the radial direction (i.e. in the r-direction in the pupil plane) the uniformity in the field plane is determined by the reflection characteristics in the pupil honeycomb plate. If there are no suitable reflection characteristics in this case it is necessary to make respective corrections as explained above.

The invention also allows realizing different illumination settings in a simple way.

If one wishes to set an illumination setting which departs from the annular illumination shown in FIGS. 17a and 17b like quadrupolar or dipole illumination, the filters in accordance with the invention can be used to block the sub-pupils that are no longer required by suitable diaphragms in the field facet plane. A sub-pupil shall be understood as being a secondary light source image as formed by a single channel of the honeycomb condenser comprising 122 honeycomb channels for example.

For this purpose it is necessary according to FIGS. 13 and 14 to determine the line on the field honeycombs for each channel and for each field height for which a sub-pupil is illuminated. It must be taken into account that every pupil honeycomb corresponds to a secondary light source image. In order to set the respective illumination the respective regions that are not to be illuminated must be stopped down or blocked by respective diaphragms, with the diaphragms blocking the field honeycombs only in part due to the rotation of the pupil.

FIGS. 18a and b show the case for a dipole illumination. Dipole illumination can lead to an increase in contrast and depth of field in the projection. Reference is hereby made to H. H. Hopkins, *On the diffraction theory of optical images*, Proc. Roy. Soc. London, A 271, pp. 408-432 (1953) (cf. cit. loc. Chapter 3, page 422). As is shown in FIG. 18, different channels or associated regions on the field honeycombs must be blocked as a result of the rotation of the exit pupil in a field-dependent way.

The pupil illumination for the central field point 401 is shown in FIG. 18a for the case of a dipole illumination. For dipole illumination the pupil is only illuminated in two off axis regions which in the present case are displaced in the X-direction relative to the optical axis. To ensure a dipole illumination only the dark spots in the region designated with reference number 407 are illuminated.

The pupil for the off-axis field point 411 is obtained by rotation about an angle φ. The pupil for an off-axis field point is shown in FIG. 18b. If one compares the pupil illumination for the different field points 401 and 411, the pupil illumination associated to the central field point 401 which is also designated as point (0,0) in the X/Y system of coordinates in the field plane appears to be rotated about the angle φ for the field point 411. The dark spots in the region 417 of the pupil associated to the field point 411 corresponds to the illumination designated by reference numeral 407 in FIG. 18a. To ensure the same pupil illumination for the central field point 401 as well as the off-axis field point 411 suitable diaphragms in front of the field honeycombs such that for the central field point the pupil honeycombs and thus the honeycomb channels are stopped down in the region 409 in the pupil plane can be provided, whereas the channels which illuminate the region 407 are translucent. For the field point 411 the channels which correspond to the illumination 419 are stopped down and the ones which are translucent are corresponding to the region 417. How this is achieved is explained below by way of an example with reference to a quadrupolar setting.

The determination of the diaphragms in accordance with the invention for making the settings is shown by way of an example of the quadrupolar setting in FIGS. 19 to 23. The exit pupil of the illumination system which coincides with the projection lens is to be illuminated with respect to each field point only in the regions 520, as shown in FIGS. 20 to 23. As described above, in an EUV system with a field-forming grazing-incidence mirror the image of the pupil honeycomb plate rotates in the exit pupil of the illumination system when a field-forming mirror is used for imaging the pupil honeycomb plate into the exit pupil.

The ring field 506 to be illuminated in the field plane 114 of a scanning projection illumination system is shown in FIG. 19. A scanning projection illumination system is shown in FIG. 12 by way of an example.

A total of four field points 501.1, 502.2, 503.3 and 504.4 are shown in the ring field to be illuminated.

Figure 20:
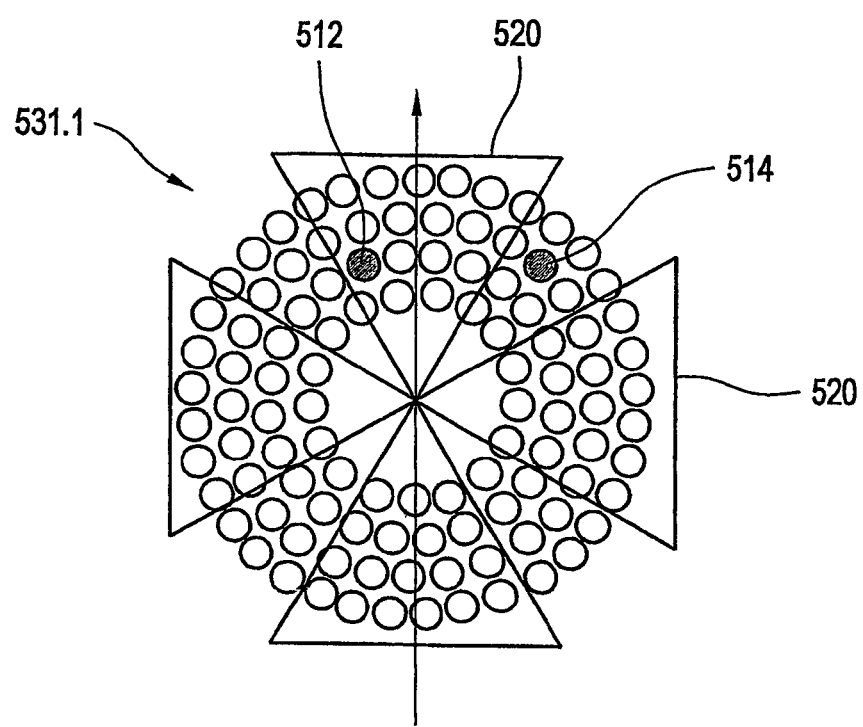
Figure 21:
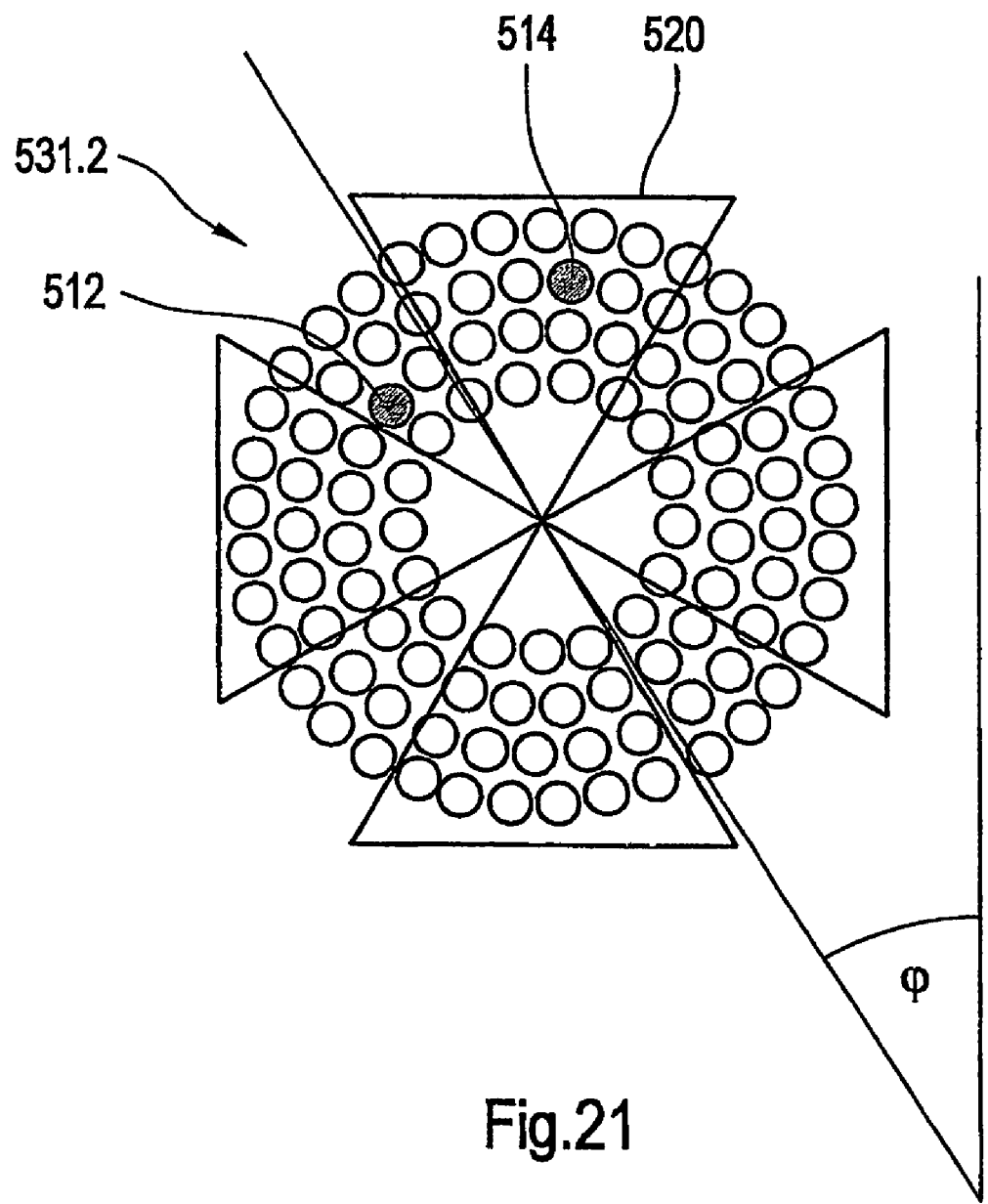
Figure 22:
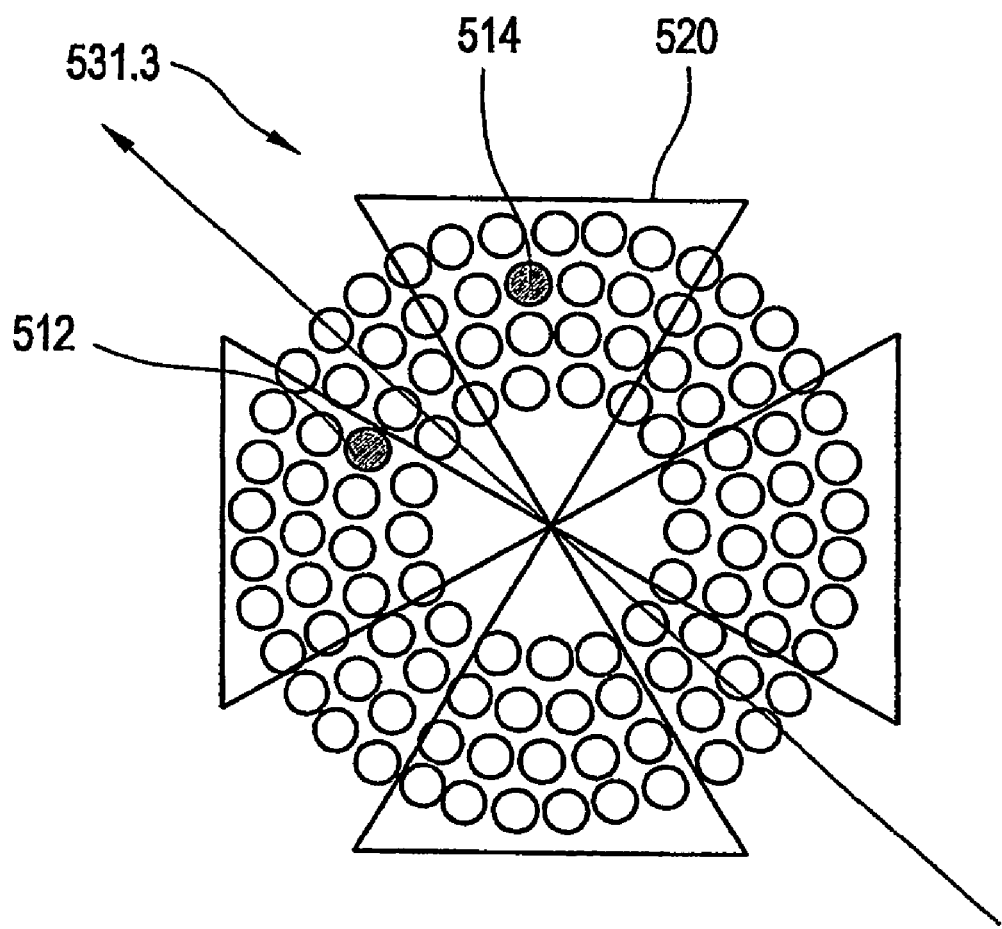
Figure 23:
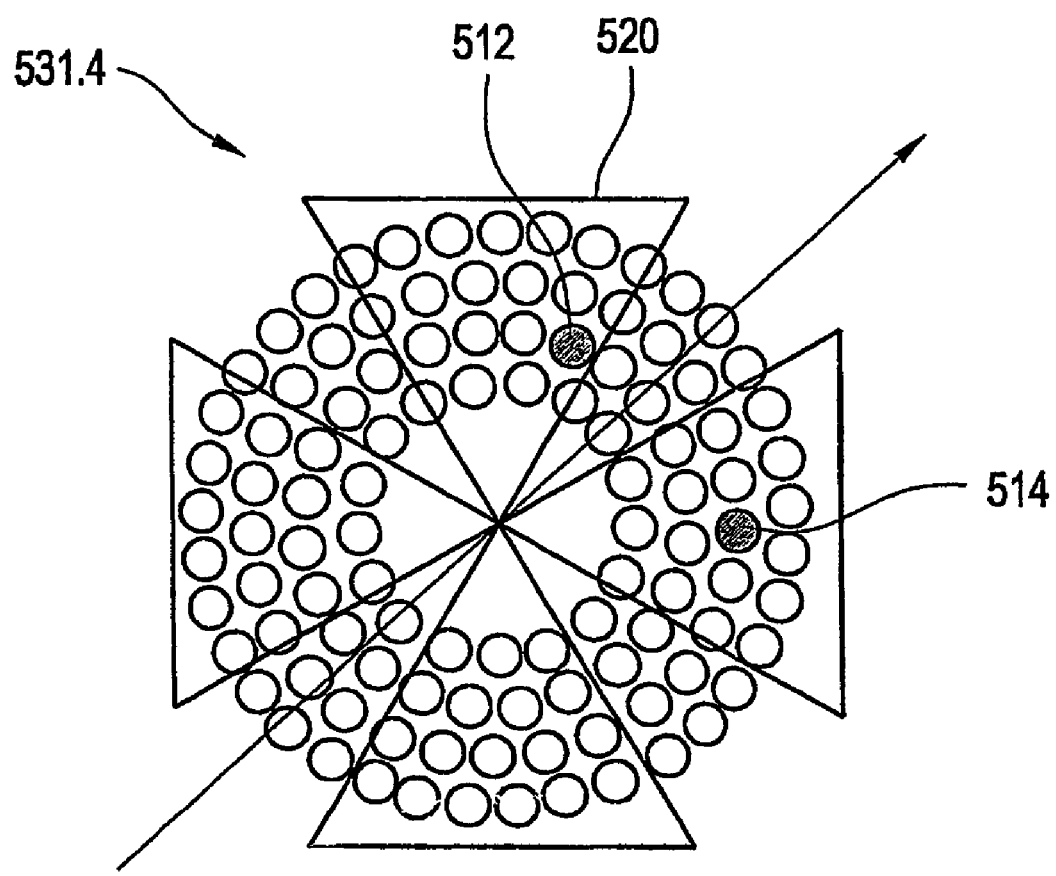

The exit pupils which belong to the different field points are shown in FIGS. 20 to 23. FIG. 20 shows the exit pupil 531.1 of the central field point 501.1. FIG. 21 shows the exit pupil 531.2 of a field point 501.2 which is rotated about the angle φ. FIG. 22 shows the exit pupil 531.3 of a field point 501.3 at the left field edge and FIG. 23 shows the exit pupil 531.4 of a field point 501.4 at the right field edge.

FIG. 19 further shows for the first optical element with first raster elements (the so-called field honeycomb condenser) two first raster elements 502, 504 out of e.g. 122 first raster elements. The two first raster elements 502, 504 are designated as first first raster element 502 and second first raster element 504 in the description below.

Each first raster element or so called field honeycomb is associated to a second raster element or a so called pupil honeycomb and thus associated to a sub-pupil in the exit pupil belonging to the respective field point. The sub-pupil of the first first raster element 502 is designated with 512. The subpupil of the second first raster element 504 is designated with 514.

If one regards the exit pupil 531.1 in FIG. 20 which is assigned to the field point 501.1 of the ring field 506, the sub-pupil which is assigned to the first first raster element 502 lies within the region 520 to be illuminated of the exit pupil 531.1. The sub-pupil 514 assigned to the second first raster element 504 lies outside of the region 520 to be illuminated of the exit pupil 531.1 which is assigned to the central field point (0,0).

The associated exit pupil is produced through rotation for the other field points of the ring field 506. By rotating the exit pupil for other field points, the individual sub-pupils which are associated to the respective pupil honeycombs also rotate. In this way the sub-pupil 512 migrates out of the region 520 to be illuminated for the other field points. In order to still ensure a quadrupolar setting for all field points, these regions can be blocked by means of a filter diaphragm 522, 524 (as shown in FIG. 19) on the respective field honeycomb. These parts of the field honeycomb then do not contribute to the illumination of the exit pupil to this field point.

Regions in which a field honeycomb is completely blocked do not contribute to the radiant flux at the optically conjugated field point because the radiant flux is blocked for this channel. As is shown in FIG. 18a to b and 20 to 23, a structured illumination can thus be realized. As a result of a wedge-shaped configuration of the filter diaphragms 522, 524 situated e.g. before a single raster element, a soft gradient is achieved in the pupil. At the same time, this gradient is used to prevent jumps in the uniformity of the illumination in the reticle plane. A soft gradient is given in such a way that the sub-pupils are not blocked abruptly when moving transversally to the scanning direction through the field. Instead, a honeycomb channel is slowly blocked or turned off and slowly turned on within a certain height in X-direction. This can be achieved by a diaphragm margin which has a slope relative to the projected scanning direction according to FIG. 19.

FIG. 20 shows the sub-pupils for 107 channels for the exit pupil which is assigned to the central field point. The sub-pupils associated to the field honeycombs 502, 504 being designated with reference numerals 512, 514 and being emphasized. Only the sub-pupils in the bordered regions 520 of the exit pupil 531.1 should contribute to the quadrupolar illumination. That is why the right one of the two sub-pupils 514 which corresponds to field honeycomb 504 in FIG. 19 must be blocked by a local diaphragm e.g. arranged before the respective field honeycomb 504.

FIG. 21 shows the exit pupil 531.2 for a field point which is obtained by rotation about the angle φ which corresponds to the field height x. The sub-pupils are all rotated about the angle φ. Now the sub-pupil 514 which is assigned to the field honeycomb 504 must contribute to the illumination, i.e. no stopping or blocking diaphragm must be located at the position of the field honeycomb 504 shown in FIG. 19. The field honeycomb 502 of FIG. 19 on the other hand contributes only partly to the desired illumination with the sub-pupil 512 and therefore needs to be stopped partially in order to illuminate only the bordered region 520 of the pupil 531.2 associated to the field point 501.2 of FIG. 19.

FIGS. 22 and 23 show the exit pupils 531.3, 531.4 with respect to the field points 501.3, 501.4 of FIG. 19 at the left field edge and the right field edge of the ring field 506. FIG. 22 show the exit pupil 531.3 for the left edge field point 501.3 and FIG. 23 show the pupil 531.4 for the right edge field point 501.4. The sub-pupils of the respective field honeycombs 502, 504 are designated with 512 and 514.

FIG. 24 shows a diaphragm in front of the field honeycombs in accordance with the state of the art, e.g. WO 02/27401, whose scope of disclosure is hereby fully included in the present application. In the embodiment according to FIG. 24, the diaphragm is configured in such a way that only completely illuminated field honeycombs are projected into the field plane. In total, the first optical element comprises 122 first raster elements for example, namely so-called field honeycombs.

In contrast to FIG. 24, FIG. 25 shows an embodiment of a filter 602 which can be used as a correction element 1000 e.g. in an EUV-projection exposure apparatus as shown for example in FIG. 12 in accordance with the invention for a first optical element with field honeycombs. If the uniformity error is already very low (e.g. approx. 2%), the residual uniformity error can be corrected by the diaphragms 604 in accordance with the invention by filtering in only very few honeycomb channels. In the illustrated example, small stopdowns or blocking areas 606 are attached only at the eight accessible field honeycombs or first raster elements 603.1, 603.2, 603.3, 603.4, 603.5, 603.6, 603.7, 603.8 at the edge of the diaphragm 604 which correct the uniformity error of approx. 3% especially 2% to less than approx. 0.5%. This is shown for an EUV-projection exposure apparatus as depicted in FIG. 12 for example in FIGS. 15 and 16.

If a general diffuser is used instead of the described honeycomb condenser, the filter can be transferred in a simple way. Like honeycomb condensers, diffusers mostly have a rastered structure and the radiant flux which illuminates a field point can be assigned to a finite number of assignable points on the diffuser. The radiant flux and thus the uniformity in its entirety can then be influenced on the same by a grey filter. Holographic diffusers which as a result of production tolerances do not homogeneously illuminate the field plane in the desired way can be calculated and designed like the holographic diffuser with the difference that this correction filter applies only minor changes to the radiant flux and can therefore be configured in a less sensitive way and in a better way than a mere absorption filter. If the diffuser is realized by a plurality of mirrors or prisms as shown by Kurtz et al., Design and synthesis of random phase diffusers, J. Opt. Soc. Am. 63, p. 1080-1092 (1973), the reflection characteristics of such a diffuser can be corrected with the filter or correction element in accordance with the invention.

The present invention provides for the first time an illumination system with a honeycomb condenser which provides for a constant pupil illumination over the field plane to be illuminated as well as a homogeneous illumination of the field plane, The constant pupil illumination, as expressed by a low σ-variation of less than 10%, is achieved simultaneous with a uniform illumination of the field with deviations from the ideal uniformity of less than 0.5%. In addition to a uniform illumination, the filter element in accordance with the invention simultaneously allows maintaining the telecentricity properties and the projection settings for high-contrast projection in the microlithography of semi-conductor structures.

The invention claimed is:

1. An illumination system configured to illuminate a field in a field plane, the illumination system comprising:
    at least one optical integrator which splits a light bundle emitted by a light source into a plurality of light channels each having a light intensity; and
    a filter in the light path from the light source to the field plane, with the filter comprising filter elements which are configured in such a way that the light intensity of at least one light channel is reduced in the light path after the filter elements,
    wherein:
        the optical integrator comprises a first optical element with a plurality of first raster elements;
        the optical integrator comprises a second optical element with a plurality of second raster elements;

the plurality of first raster elements is configured to be projected directly into the field plane, or to be projected via an intermediate image into the field plane;

the filter elements comprise diaphragms located in front of the plurality of first elements along the light path;

the filter elements are configured to vary an expansion of the light channels in a scanning direction; and the illumination system is configured to be used in EUV microlithography with light of a wavelength in the region between about 11 nm and about 14 nm.

2. The illumination system as claimed in claim 1, wherein a reduction of the light intensity of the at least one light channel after the filter elements is within >0 and <100% of the light intensity of the respective light channel before the filter elements.

3. The illumination system as claimed in claim 2, wherein a reduction of the light intensity of the at least one light channel after the filter elements is within >25% and <80% of the light intensity of the respective light channel before the filter elements.

4. The illumination system as claimed in claim 2, wherein the at least one light channel illuminates a surface of the filter elements and that the filter elements are arranged such that the reduction of the light intensity is different at different places of the illuminated surface.

5. The illumination system as claimed in claim 2, wherein the at least one light channel illuminates a surface of the filter elements and the filter elements are arranged such that the reduction of the light intensity is the same at different places of the illuminated surface.

6. The illumination system as claimed in claim 1, wherein the field is a ring field with a radial and azimuthal extension.

7. The illumination system as claimed in claim 6, wherein the optical element comprises at least a field forming optical component and the optical component is sufficiently corrected in an aplanatic way at least in the radial alignment of the pupil image.

8. The illumination system as claimed in claim 1, wherein the filter element is arranged in the light path from the light source to the field plane close to the optical integrator as a separate component, or is integrated in the optical integrator.

9. The illumination system as claimed in claim 1, wherein the filter element is arranged in the light path from the light source to the field plane close to the optical integrator.

10. The illumination system as claimed in claim 1, wherein the filter element is changeable.

11. A projection exposure system comprising:
a light source,
an illumination system as claimed in claim 1 configured to illuminate a field in a field plane, and
a projective objective configured to project an object arranged in the field plane into an image in an image plane,
wherein the projection exposure system is a scanner type projection exposure apparatus configured to be used in EUV microlithography.

12. A method, comprising:
using a projection exposure system to produce microstructured components, the projection exposure system comprising:
a light source,
an illumination system as claimed in claim 1 configured to illuminate a field in a field plane, and
a projective objective configured to project an object arranged in the field plane into an image in an image plane,
wherein the projection exposure system is a scanner type projection exposure apparatus configured to be used in EUV microlithography.

13. The illumination system of claim 1, wherein the illumination system is configured so that a reduction of light intensity occurs in a location-dependent manner.

14. The illumination system of claim 1, wherein the filter elements comprise active filter elements so that the light intensity is reduced in a variable manner.

15. The illumination system of claim 14, wherein the active filter elements comprise comb diaphragms that are rotatable into the light path.

16. The illumination system of claim 1, wherein the filter elements are configured and arranged so that a substantially homogeneous illumination of the field in the field plane perpendicular to the scanning direction is achieved, so that uniformity errors of a scanning energy in the field plane are less than ±3%, with the scanning energy being the illumination intensity of a field integrated in a scanning direction.

17. The illumination system of claim 16, wherein uniformity errors are less than ±1%.

* * * * *

UNITED STATES PATENT AND TRADEMARK OFFICE
CERTIFICATE OF CORRECTION

| | | |
|---|---|---|
| PATENT NO. | : 7,911,584 B2 | |
| APPLICATION NO. | : 10/563175 | |
| DATED | : March 22, 2011 | |
| INVENTOR(S) | : Singer et al. | |

It is certified that error appears in the above-identified patent and that said Letters Patent is hereby corrected as shown below:

Column 6,
Line 36, Delete "i.e:" and insert --i.e.--

Column 10,
Line 57, Delete "$a_1$," and insert --$a_1$--

Column 13,
Line 12, Delete "3.3.1;" and insert --3.3.1,--

Column 17,
Line 40, Delete "example;" and insert --example,--

Column 18,
Line 51, Delete "anomorphic" and insert --anamorphic--

Column 18,
Line 64, Delete "anomorphic" and insert --anamorphic--

Column 18,
Line 67, Delete "anomorphic" and insert --anamorphic--

Column 22,
Line 43, Delete "plane" and insert --plane.--

Signed and Sealed this
Tenth Day of May, 2011

David J. Kappos
*Director of the United States Patent and Trademark Office*